US007086038B2

(12) United States Patent
Cronquist et al.

(10) Patent No.: US 7,086,038 B2
(45) Date of Patent: Aug. 1, 2006

(54) SYSTEM AND METHOD FOR CREATING SYSTOLIC SOLVERS

(75) Inventors: Darren C. Cronquist, San Francisco, CA (US); Michael S. Schlansker, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 684 days.

(21) Appl. No.: 10/266,720

(22) Filed: Oct. 7, 2002

(65) Prior Publication Data

US 2004/0068718 A1    Apr. 8, 2004

(51) Int. Cl.
*G06F 9/45* (2006.01)
(52) U.S. Cl. ................. 717/136; 717/150; 717/151
(58) Field of Classification Search ........ 717/136–140, 717/146–160
See application file for complete search history.

(56) References Cited

U.S. PATENT DOCUMENTS

| | | | | |
|---|---|---|---|---|
| 5,802,375 | A | * | 9/1998 | Ngo et al. ................... 717/160 |
| 6,023,742 | A | * | 2/2000 | Ebeling et al. ............. 710/107 |
| 6,038,398 | A | | 3/2000 | Schooler et al. |
| 6,059,841 | A | | 5/2000 | Caracuzzo |
| 6,151,703 | A | * | 11/2000 | Crelier ........................ 717/136 |
| 6,274,403 | B1 | * | 8/2001 | Klages et al. ............... 438/105 |
| 6,282,706 | B1 | * | 8/2001 | Chauvel et al. ............. 717/150 |
| 6,286,135 | B1 | * | 9/2001 | Santhanam .................. 717/146 |
| 6,374,403 | B1 | * | 4/2002 | Darte et al. ................. 717/161 |
| 6,438,747 | B1 | * | 8/2002 | Schreiber et al. ........... 717/160 |
| 6,507,947 | B1 | * | 1/2003 | Schreiber et al. ........... 717/160 |
| 6,651,246 | B1 | * | 11/2003 | Archambault et al. ...... 717/160 |
| 6,711,717 | B1 | * | 3/2004 | Nystrom et al. ............... 716/1 |
| 6,735,760 | B1 | * | 5/2004 | Dice .......................... 717/139 |
| 6,799,315 | B1 | * | 9/2004 | Waki et al. .................. 717/148 |
| 6,817,013 | B1 | * | 11/2004 | Tabata et al. ............... 717/151 |
| 6,952,816 | B1 | * | 10/2005 | Gupta et al. .................. 716/18 |

OTHER PUBLICATIONS

Rauber et al, "Optimizing locality for ODE solvers", ACM ICS, pp. 123-132, 2001.*
Hu et al, "Memory requirement optimization with loop fusion and loop shifting", IEEE DSD, pp. 1-7, 2004.*
Lim et al, "Blocking and array contraction across arbitarily nested loops using affine partitioning", ACM PPOPP, pp. 103-112, 2001.*
Philippsen et al, "Compiling machine independent parallel programs", ACM SIGPLAN, vol. 28, No. 8, pp. 99-108, 1993.*
Schreiber R et al—"High-Level Synthesis of Nonprogrammable Hardware Accelerators"—Proc IEEE Int'l Conf Application-Specific Systems, Architecture & Processors Jul. 10, 2000.

(Continued)

*Primary Examiner*—Anil Khatri

(57) ABSTRACT

One embodiment of the invention is a method for forming a solver for a loop nest of code, the method comprising forming a time and space mapping of a portion of the loop nest, performing at least one optimization that is dependent on the time and space mapping to the portion of the loop nest, and forming a solver from the optimized portion of the loop nest.

39 Claims, 25 Drawing Sheets

OTHER PUBLICATIONS

Hewlett-Packard Company—"Parallel Programming Guide for HP-UX Systems: K-Class and V-Class Servers" Mar. 2000 (60 pages).

Callahan T J et al—"The Garp Architecture and C Compiler"—IEEE Computer Society vol. 33 No. 4 Apr. 2000—pp. 63-69.

M. Schlansker et al. "Acceleration of First and Higher Order Recurrences on Processors with Instruction Level Parallelism." Hewlett-Packard Laboratories, pp. 406-429.

B.R Rau, "Data Flow and Dependence Analysis for Instruction Level Parallelism." Hewlett-Packard Laboratories, pp. 236-250.

D. J. Kuck, et al. "Dependence Graphs and Compiler Optimizations." Association for Computing Machinery. (1981). pp. 207-218.

B. Ramakrisna Rau, "Iteractive Modulo Scheduling." Compiler and Architecture Research—Hewlett-Packard, (Nov. 1995). pp. 1-67.

* cited by examiner

FIG. 4A

```
for a₁=0 to A₁-1
  for a₂=0 to A₂-1
    ⋮
    for aₖ=0 to Aₖ-1  ~403
      ⋮                TARGET LOOP
      for aₙ=0 to Aₙ-1
        OP₁
        OP₂
        ⋮
        OPₜ
      end (aₙ)
```
401

FIG. 4B

```
for a₁=0 to A₁-1
  for a₂=0 to A₂-1
    ⋮
    for a'ₖ=0 to Aₖ/P-1  ⟵404
      ⋮                   RESIDUAL AFTER
                          SPATIAL STRIP-MINING
      for aₙ=0 to Aₙ-1
        for s=0 to P-1  OP₁  ⎫
        for s=0 to P-1  OP₂  ⎬ 405
        ⋮                    ⎪ EACH OP LOOPS
        for s=0 to P-1  OPₜ  ⎭ OVER SPACE
      end (aₙ)
```
402

FIG. 5

```
for a_1=0 to A_1-1
  for a_2=0 to A_2-1        ⎫
    ⋮                        ⎬ 503
  for a_{N-1}=0 to A_{N-1}-1⎭  LOOPS OVER TIME

** BEGIN INNER-LOOP SOLVER
    for a_N=0 to A_N-1 — INNER-TIME LOOP
      for s=0 to P-1 OP_1  ⎫
      for s=0 to P-1 OP_2  ⎬ 502
        ⋮                   ⎪ EACH OP LOOPS
      for s=0 to P-1 OP_T  ⎭ OVER SPACE
    end (a_N)

** END INNER-LOOP SOLVER end (a_{N-1})
    ⋮
  end (a_2)
end (a_1)
```

```
for a_1=0 to A_1-1  ⎫
  for a_2=0 to A_2-1 ⎬ LOOPS OVER TIME
    for a_3=0 to A_3-1
      for a_4=0 to A_4-1 ⎭

** BEGIN INNER-LOOP SOLVER
      for a_5=0 to A_5-1 — INNER-TIME LOOP
        for s=0 to P-1  C[a_2, a_1, a_5, s] = C[a_2, a_1, a_5, s] + ...
      end (a_5)
      ** END INNER-LOOP SOLVER        603
    end (a_4)
    end (a_3)
  end (a_2)
end (a_1)
```

```
for a₁=0 to A₁-1   ⎫
  for a₂=0 to A₂-1 ⎬ LOOPS OVER TIME
                   ⎭ for a₅=0 to A₅-1                    ⎫
      for s=0 to P-1                    ⎪
        C'[a₅, s] = C[a₂, a₁, a₅, s]    ⎬ 604
      end (s)                           ⎪ RELOCATION
    end (a₅)                            ⎭ INITIALIZATION LOOP for a₃=0 to A₃-1   ⎫
      for a₄=0 to A₄-1 ⎬ LOOPS OVER TIME
                       ⎭

** BEGIN INNER-LOOP SOLVER
      for a₅=0 to A₅-1 ← INNER-TIME LOOP
        for s=0 to P-1  C'[a₅, s] = C'[a₅, s] + ...
      end (a₅)
      ** END INNER-LOOP SOLVER    ←605 end (a₄)
    end (a₃)

for a₅=0 to A₅-1                    ⎫
      for s=0 to P-1                    ⎪
        C[a₂, a₁, a₅, s] = C'[a₅, s]    ⎬ 606
      end (s)                           ⎪ RELOCATION
    end (a₅)                            ⎭ FINALIZATION
                                          LOOP end (a₂)
end (a₁)
```

```
for a₁=0 to A₁-1    ⎫
  for a₂=0 to A₂-1  ⎬ LOOPS OVER TIME
                    ⎭ for a₅=0 to A₅-1                        ⎫
      for s=0 to P-1                        ⎪
701⟶ lmem(s)[a₅] = C[a₂, a₁, a₅, s]         ⎬ PLACEMENT
      end (s)                               ⎪ INITIALIZATION
    end (a₅)                                ⎭ LOOP for a₃=0 to A₃-1   ⎫
      for a₄=0 to A₄-1 ⎬ LOOPS OVER TIME
                       ⎭

** BEGIN INNER-LOOP SOLVER
      for a₅=0 to A₅-1 ⟵ INNER-TIME LOOP
        for s=0 to P-1 lmem(s)[a₅] = lmem(s)[a₅] +... ⟵ 702
      end (a₅)
      ** END INNER-LOOP SOLVER end (a₄)
    end (a₃)

for a₅=0 to A₅-1              ⎫
      for s=0 to P-1              ⎪
        C[a₂, a₁, a₅, s] = lmem(s)[a₅]  ⎬ 703
      end (s)                     ⎪ PLACEMENT
    end (a₅)                      ⎭ FINALIZATION LOOP end (a₂)
end (a₁)
```

```
for a₁=0 to A₁-1
  for a₂=0 to A₂-1              ⎫
    ⋮                            ⎬ LOOPS OVER TIME
    for a_{N-1}=0 to A_{N-1}-1   ⎭
      ** BEGIN INNER-LOOP SOLVER
      for a_N=0 to A_N-1 ← INNER-TIME LOOP
        for s=0 to P-1 OP₁  ⎫
        for s=0 to P-1 OP₂  ⎬ EACH OP LOOPS
        ⋮                    ⎭ OVER SPACE
        for s=0 to P-1 OP_T
      end (a_N)
      ** END INNER-LOOP SOLVER
    end (a_{N-1})
    ⋮
  end (a₂)
end (a₁)
```

```
for a₁=0 to A₁-1
  for a₂=0 to A₂-1              ⎫
    ⋮                            ⎬ LOOPS OVER TIME
    for a_{N-1}=0 to A_{N-1}-1   ⎭
      for s=0 to P-1   ⎫ REDUCTION
        Init Code       ⎬ INITIALIZATION LOOP
      end (s)           ⎭
      ** BEGIN INNER-LOOP SOLVER
      for a_N=0 to A_N-1 ← INNER-TIME LOOP
        for s=0 to P-1 OP'₁  ⎫
        for s=0 to P-1 OP'₂  ⎬ EACH OP LOOPS
        ⋮                     ⎭ OVER SPACE
        for s=0 to P-1 OP'_T
      end (a_N)
      ** END INNER-LOOP SOLVER
      for s=0 to P-1       ⎫ REDUCTION
        Finalization Code  ⎬ FINALIZATION
      end (s)              ⎭ LOOP
    end (a_{N-1})
    ⋮
  end (a₂)
end (a₁)
```

```
for a₁=0 to A₁-1        ⎫
  for a₂=0 to A₂-1      ⎪
    ⋮                    ⎬ LOOPS OVER TIME
      for a_{N-1}=0 to A_{N-1}-1  ⎭

** BEGIN INNER-LOOP SOLVER
      for a_N=0 to A_N-1 ←— INNER-TIME LOOP
         OP_v  ⎫
         OP_w  ⎬ SINGLE STATEMENT CODE
         OP_x  ⎭ for s=0 to P-1  OP'₁  ⎫ EACH OP LOOPS
         for s=0 to P-1  OP'₂  ⎬ OVER A RANGE
                               ⎭ OF SPACE OP_y  ⎫
         OP'₃  ⎬ SINGLE STATEMENT CODE
         OP'₄  ⎭ for s=2 to P-1  OP'₅  ⎫
         for s=2 to P-1  OP'₆  ⎪ EACH OP LOOPS
         for s=2 to P-1  ...   ⎬ OVER A RANGE
         for s=2 to P-1  OP'_T ⎭ OF SPACE
      end (a_N)

** END INNER-LOOP SOLVER end (a_{N-1})
    ⋮
  end (a₂)
end (a₁)
```

```
for a_1=0 to A_1-1
  for a_2=0 to A_2-1            ⎤
    ⋮                            ⎬ LOOPS OVER TIME
    for a_{N-1}=0 to A_{N-1}-1  ⎦
      ** BEGIN INNER-LOOP SOLVER
      for a_N=0 to A_N-1 ⟵ INNER-TIME LOOP
        for s=0 to P-1  OP_1  ⎤
        for s=0 to P-1  OP_2  ⎥
          ⋮                    ⎬ 903
                               ⎥ EACH OP LOOPS
        for s=0 to P-1  OP_T  ⎦ OVER SPACE
      end (a_N)
      ** END INNER-LOOP SOLVER
    end (a_{N-1})
    ⋮
  end (a_2)
end (a_1)
```
901

FIG. 9B

```
for a_1=0 to A_1-1
  for a_2=0 to A_2-1            ⎤
    ⋮                            ⎬ LOOPS OVER TIME
    for a_{N-1}=0 to A_{N-1}-1  ⎦
      for s=0 to P-1       ⎤
        Init Code          ⎬ 904
      end (s)              ⎦ TEMPORAL INITIALIZATION LOOP
      ** BEGIN INNER-LOOP SOLVER
      for a_N=0 to A_N-1 ⟵ INNER-TIME LOOP
        for s=0 to P-1  OP'_1  ⎤
        for s=0 to P-1  OP'_2  ⎥
          ⋮                     ⎬ 905
                                ⎥ EACH OP LOOPS
        for s=0 to P-1  OP'_T  ⎦ OVER SPACE
      end (a_N)
      ** END INNER-LOOP SOLVER
      for s=0 to P-1          ⎤
        Finalization Code     ⎬ 906
      end (s)                 ⎦ TEMPORAL FINALIZATION LOOP
    end (a_{N-1})
    ⋮
  end (a_2)
end (a_1)
```
902

FIG. 9C

```
for a₁=0 to A₁-1           ⎫
  for a₂=0 to A₂-1          ⎪
    ⋮                       ⎬ LOOPS OVER TIME
      for a_{N-1}=0 to A_{N-1}-1 ⎭

** BEGIN INNER-LOOP SOLVER
        for a_N=0 to A_N-1  ← INNER-TIME LOOP
          OP_v  ⎫
          OP_w  ⎬ 909
          OP_x  ⎭ SINGLE STATEMENT CODE for s=0 to 1  OP'_1  ⎫ 910
          for s=0 to 1  OP'_2  ⎬ EACH OP LOOPS OVER
            ⋮                   ⎭ A RANGE OF SPACE OP_y  ⎫
          OP'_3 ⎬ 911
          OP'_4 ⎭ SINGLE STATEMENT CODE for s=2 to P-1 OP'_5 ⎫
          for s=2 to P-1 OP'_6 ⎪ 912
          for s=2 to P-1 ...   ⎬ EACH OP LOOPS OVER
          for s=2 to P-1 OP'_T ⎭ A RANGE OF SPACE
        end (a_N)
      ** END INNER-LOOP SOLVER end (a_{N-1})
    ⋮
  end (a_2)
end (a_1)
```

```
********** Matrix Multiply (MATMUL) - Original Code **********
for i = 0 to L-1
  for k = 0 to M-1
    for j = 0 to N-1
OP1:     C[i,j] = C[i,j] + A[i,k]*B[k,j]  ## associative
    end (j)
  end (k)
end (i)
```

```
********** MATMUL A - Time Mapping ***********
** Time permutation choice: i,j,k
for i = 0 to L-1
   for j = 0 to N-1
      for k = 0 to M-1
OP11:    C[i,j] = C[i,j] + A[i,k]*B[k,j]
      end (k)
   end (j)
end (i)
```
←1101

FIG. 11B

```
************* MATMUL A - Spatial Strip-mining **********
** Space choice: loop j
** j-loop replaced with s loop (space) and j'-loop (residual)
** such that j = 4*j' + s
for i = 0 to L-1
   for j' = 0 to N/4-1

** BEGIN INNER-LOOP SOLVER CODE
      for k = 0 to M
OP21:    for s = 0 to 3  C[i,4*j'+s] = C[i,4*j'+s] + A[i,k]*B[k,4*j'+s]
      end (k)
      ** END INNER-LOOP SOLVER CODE end (j')
end (i)
```
←1102

*FIG. 11C*

```
************** MATMUL A - Array Relocation ***********
for j' = 0 to N/4-1
   for k = 0 to M-1
      for s = 0 to 3
         B'[k,j',s] = B[k,4*j'+s]
      end (s)
   end (k)
end (j')
for i = 0 to L-1
   for k = 0 to M-1
      A'[i,k] = A[i,k]
   end (k)
   for j' = 0 to N/4-1
      for s = 0 to 3
         C'[s] = C[i,4*j'+s]
      end (s)

** BEGIN INNER-LOOP SOLVER CODE
      for k = 0 to M-1
OP31:       A" = A'[i,k]
OP32:       for s = 0 to 3  C'[s] = C'[s] + A" * B'[k,j',s]
      end (k)
      ** END INNER-LOOP SOLVER CODE for s = 0 to 3
         C[i,4*j'+s] = C'[s]
      end (s)
   end (j')
end (i)
```

```
********** MATMUL A - Unrolled code **************
for j' = 0 to N/4-1
   for k = 0 to M-1
      lmem(0)[j'*M + k] = B[k,4*j']
      lmem(1)[j'*M + k] = B[k,4*j'+1]
      lmem(2)[j'*M + k] = B[k,4*j'+2]
      lmem(3)[j'*M + k] = B[k,4*j'+3]
   end (k)
end (j')
for i = 0 to L-1
   for k = 0 to M-1
      lmem(4)[i*M+k] = A[i,k]
   end (k)
   for j' = 0 to N/4
      reg(0) = C[i,4*j']
      reg(1) = C[i,4*j'+1]
      reg(2) = C[i,4*j'+2]
      reg(3) = C[i,4*j'+3]

** BEGIN INNER-LOOP SOLVER CODE
      for k = 0 to M-1
OP51:    reg(4) = lmem(4)[i*M+k]
OP52:    reg(0) = reg(0) + reg(4) * lmem(0)[j'*M+k]
OP53:    reg(1) = reg(1) + reg(4) * lmem(1)[j'*M+k]
OP54:    reg(2) = reg(2) + reg(4) * lmem(2)[j'*M+k]
OP55:    reg(3) = reg(3) + reg(4) * lmem(3)[j'*M+k]
      end (k)
      ** END INNER-LOOP SOLVER CODE C[i,4*j']   = reg(0)
      C[i,4*j'+1] = reg(1)
      C[i,4*j'+2] = reg(2)
      C[i,4*j'+3] = reg(3)
   end (j')
end (i)
```

```
*********** MATMUL A - Placement **************
for j' = 0 to N/4-1
   for k = 0 to M-1
      for s = 0 to 3
         lmem(s)[j'*M+k] = B[k,4*j'+s]
      end (s)
   end (k)
end (j')
for i = 0 to L-1
   for k = 0 to M-1
      lmem(4)[i*M+k] = A[i,k]
   end (k)
   for j' = 0 to N/4-1
      for s = 0 to 3
         reg(s) = C[i,4*j'+s]
      end (s)

** BEGIN INNER-LOOP SOLVER CODE
      for k = 0 to M-1
OP41:    reg(4) = lmem(4)[i*M+k]
OP42:    for s = 0 to 3 reg(s) = reg(s) + reg(4) * lmem(s)ij'*M + k]
      end (k)
      ** END INNER-LOOP SOLVER CODE for s = 0 to 3
         C[i,4*j'+s] = reg(s)
      end (s)
   end (j')
end (i)
```
← 1105

FIG. 12A

```
********** MATMUL B - Space-time mapping **********
** k targeted to space
** time permutation: j,i,k'
for j = 0 to N-1
   for i = 0 to L-1
      ** BEGIN INNER-LOOP SOLVER CODE
      for k' = 0 to M/4-1
OP61:    for s = 0 to 3  C[i,j] = C[i,j] + A[i,4*k'+s]*B[4*k'+s,j]
      end (k')
      ** END INNER-LOOP SOLVER CODE
   end (i)
end (j)
```

```
********** MATMUL B - Array Relocation **********
for i = 0 to L-1
   for k' = 0 to M/4-1
      for s = 0 to 3
         A'[i,k',s] = A[i,4*k'+s]
      end (s)
   end (k')
end (i)
for j = 0 to N-1
   for k' = 0 to M/4-1
      for s = 0 to 3
         B'[k',s] = B[4*k'+s,j]
      end (s)
   end (k')
   for i = 0 to L-1
      C' = C[i,j]
      ** BEGIN INNER-LOOP SOLVER CODE
      for k' = 0 to M/4-1
OP71:    for s = 0 to 3  C' = C' + A[i,k',s]*B'[k',s]
      end (k')
      ** END INNER-LOOP SOLVER CODE
      C[i,j] = C'
   end (i)
end (j)
```

```
********** MATMUL B - Placement *************
for i = 0 to L-1
   for k' = 0 to M/4-1
      for s = 0 to 3
         Imem(s)[i*M/4+k'] = A[i,4*k'+s]
      end (s)
   end (k')
end (i)
for j = 0 to N-1
   for k' = 0 to M/4-1
      for s = 0 to 3
         Imem(s+4)[4*k'] = B[4*k'+s,j]
      end (s)
   end (k')
   for i = 0 to L-1
      reg(4) = C[i,j]

** BEGIN INNER-LOOP SOLVER CODE
      for k' = 0 to M/4-1
OP81:       for s = 0 to 3 reg(4) = reg(4) + Imem(s)[i*M/4+k']*Imem(s+4)[4*k']
      end (k')
      ** END INNER-LOOP SOLVER CODE C[i,j] = reg4
   end (i)
end (j)
```

```
*********** MATMUL B - Reductions *************
for i = 0 to L-1
   for k' = 0 to M/4-1
      for s = 0 to 3
         lmem(s)[i*M/4+k'] = A[i,4*k'+s]
      end (s)
   end (k')
end (i)
for j = 0 to N-1
   for k' = 0 to M/4-1
      for s = 0 to 3
         lmem(s+4)[4*k'] = B[4*k'+s,j]
      end (s)
   end (k')
   for i = 0 to L-1
      reg(4) = C[i,j]

** BEGIN INNER-LOOP SOLVER CODE
      for k' = 0 to M/4-1
OP91:    for s = 0 to 3 reg(s) = lmem(s)[i*M/4+k']*lmem(s+4)[4*k']
OP92:    reg(5) = reg(0) + reg(1)
OP93:    reg(6) = reg(2) + reg(3)
OP94:    reg(7) = reg(5) + reg(6)
OP95:    reg(4) = reg(4) + reg(7)
      end (k')
      ** END INNER-LOOP SOLVER CODE C[i,j] = reg(4)
   end (i)
end (j)
```

```
******************** Sobel - Original Code ************************
for i = 0 to L-1
   for j = 0 to M-1
OP1:     a = x[i,j] + 2*x[i,j+1] + x[i,j,+2]
OP2:     b = x[i+2,j] + 2*x[i+2,j+1] + x[i+2,j+2]
OP3:     c = a-b
OP4:     edge[i,j] = c*c > threshold
   end (j)
end (i)
```
— 1301

*FIG. 14A*                                                1401

```
*************** Sobel - After time and space mapping ***************
for i' = 0 to L/4-1
   ** BEGIN INNER-LOOP SOLVER CODE
   for j = 0 to M-1
OP11:    for s = 0 to 3 a(s) = x[4*i'+s,j] + 2*x[4*i'+s,j+1] + x[4*i'+s,j+2]
OP12:    for s = 0 to 3 b(s) = x[4*i'+s+2,j] + 2*x[4*i'+s+2,j+1] + x[4*i'+s+2,j+2]
OP13:    for s = 0 to 3 c(s) = a(s)-b(s)
OP14:    for s = 0 to 3 edge[4*i'+s,j] = c[s]*c[s] > threshold
   end (j)
   ** END INNER-LOOP SOLVER CODE
end (i')
```

*FIG. 14B*                                                1450

```
*************** Sobel - Placement ***************
reg(12) = threshold
for i' = 0 to L/4-1
   ** BEGIN INNER-LOOP SOLVER CODE
   for j = 0 to M-1
OP21:    for s = 0 to 3 reg(s) = x[4*i'+s,j] + 2*x[4*i'+s,j+1] + x[4*i'+s,j+2]
OP22:    for s = 0 to 3 reg(s+4) = x[4*i'+s+2,j] + 2*x[4*i'+s+2,j+1] + x[4*i'+s+2,j+2]
OP23:    for s = 0 to 3 reg(s+8) = reg(s)-reg(s+4)
OP24:    for s = 0 to 3 edge[4*i'+s,j] = reg(s+8)*reg(s+8) > reg(12)
   end (j)
   ** END INNER-LOOP SOLVER CODE
end (i')
```

FIG. 14C

```
**** Sobel - After temporal load/store elimination ********
ref(12) = threshold
for i' = 0 to L/4-1
   for s = 0 to 3
      vr(s)[2] = x[4*i'+s,0]
      vr(s)[1] = x[4*i'+s,1]
      vr(s+4)[2] = x[4*i'+s+2,0]
      vr(s+4)[1] = x[4*i'+s+2,1]
   end (s)
   ** BEGIN INNER-LOOP SOLVER CODE
   for j = 0 to M-1
OP31:    for s = 0 to 3   vr(s)[0] = x[4*i'+s,j+2]
OP32:    for s = 0 to 3   vr(s+4)[0] = x[4*i'+s+2,j+2]
OP33:    for s = 0 to 3   reg(s) = vr(s)[2] + 2*vr(s)[1] + vr(s)[0]
OP34:    for s = 0 to 3   reg(s+4) = vr(s+4)[2] + 2*vr(s+4)[1] + vr(s+4)[0]
OP35:    for s = 0 to 3   reg(s+8) = reg(s)-reg(s+4)
OP36:    for s = 0 to 3   edge[4*i'+s,j] = reg(s+8)*reg(s+8) > reg(12)
OP37:    for s = 0 to 3   remap vr(s)
OP38:    for s = 0 to 3   remap vr(s+4)
   end (j)
   ** END INNER-LOOP SOLVER CODE
end (i')
```

1402

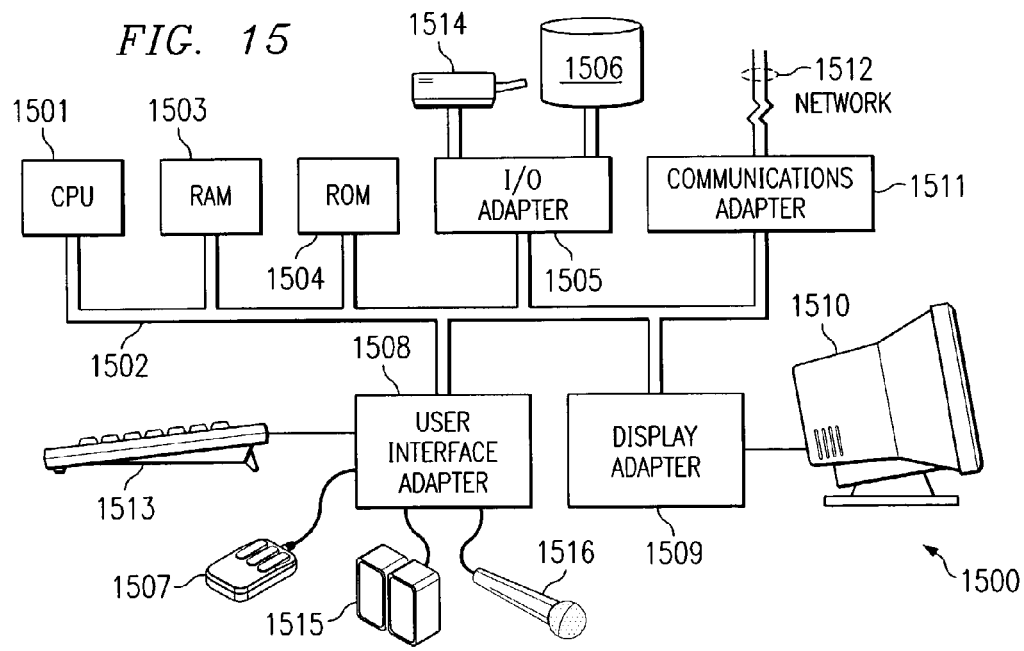

```
******** Sobel - After spatial load/store elimination ************
ref(12) = threshold
for i' = 0 to L/4-1
   for s = 0 to 1
      vr(s)[2] = x[4*i'+s,0]
      vr(s)[1] = x[4*i'+s,1]
   end (s)
   for s = 0 to 3
      vr(s+4)[2] = x[4*i'+s+2,0]
      vr(s+4)[1] = x[4*i'+s+2,1]
   end (s)

** BEGIN INNER-LOOP SOLVER CODE
   for j = 0 to M-1
OP41:    for s = 0 to 1    vr(s)[0] = x[4*i'+s,j+2]
OP42:    for s = 0 to 3    vr(s+4)[0] = x[4*i'+s+2j+2]
OP43:    for s = 0 to 1    reg(s) = vr(s)[2] + 2*vr(s)[1] + vr(s)[0]
OP44:    for s = 2 to 3    reg(s) = vr(s+2)[2] + 2*vr(s+2)[1] + vr(s+2)[0]
OP45:    for s = 0 to 3    reg(s+4) = vr(s+4)[2] + 2*vr(s+4)[1] + vr(s+4)[0]
OP46:    for s = 0 to 3    reg(s+8) = reg(s)-reg(s+4)
OP47:    for s = 0 to 3    edge[4*i'+s,j] + reg(s+8)*reg(s+8) > reg(12)
OP48:    for s = 0 to 3    remap vr(s)
OP49:    for s = 0 to 3    remap vr(s+4)
   end (j)
   ** END INNER-LOOP SOLVER CODE end (i')
```

```
******** Sobel - After spatial arithmetic elimination ************
ref(12) = threshold
for i' = 0 to L/4-1
   for s = 0 to 1
      vr(s)[2] = x[4*i'+s,0]
      vr(s)[1] = x[4*i'+s,1]
   end (s)
   for s = 0 to 3
      vr(s+4)[2] = x[4*i'+s+2,0]
      vr(s+4)[1] = x[4*i'+s+2,1]
   end (s)

** BEGIN INNER-LOOP SOLVER CODE
   for j = 0 to M-1
OP51:    for s = 0 to 1    vr(s)[0] = x[4*i'+s,j+2]
OP52:    for s = 0 to 3    vr(s+4)[0] = x[4*i'+s+2,j+2]
OP53:    for s = 0 to 1    reg(s) = vr(s)[2] + 2*vr(s)[1] + vr(s)[0]
OP54:    for s = 0 to 3    reg(s+4) = vr(s+4)[2] + 2*vr(s+4)[1] + vr(s+4)[0]
OP55:    for s = 0 to 1    reg(s+8) = reg(s)-reg(s+4)
OP56:    for s = 2 to 3    reg(s+8) = reg(s+2)-reg(s+4)
OP57:    for s = 0 to 3    edge[4*i'+s,j] = reg(s+8)*reg(s+8) > reg(12)
OP58:    for s = 0 to 3    remap vr(s)
OP59:    for s = 0 to 3    remap vr(s+4)
   end (j)
   ** END INNER-LOOP SOLVER CODE
end (i')
```

```
******* Sobel – Symmetry detection ************
ref(12) = threshold
for i' = 0 to L/4-1
    for s = 0 to 1
        vr(s)[2] = x[4*i'+s,0]
        vr(s)[1] = x[4*i'+s,1]
    end (s)
    for s = 0 to 3
        vr(s+4)[2] = x[4*i'+s+2,0]
        vr(s+4)[1] = x[4*i'+s+2,1]
    end (s)

** BEGIN INNER-LOOP SOLVER CODE
    for j = 0 to M-1
OP61:    for s = 0 to 1   vr(s)[0] = x[4*i'+s,j+2]
OP62:    for s = 0 to 1   vr(s+4)[0] = x[4*i'+s+2j+2]
OP63:    for s = 2 to 3   vr(s+4)[0] = x[4*i'+s+2,j+2]
OP64:    for s = 0 to 1   reg(s) = vr(s)[2] + 2*vr(s)[1] + vr(s)[0]
OP65:    for s = 0 to 1   reg(s+4) = vr(s+4)[2] + 2*vr(s+4)[1] + vr(s+4)[0]
OP66:    for s = 2 to 3   reg(s+4) = vr(s+4)[2] + 2*vr(s+4)[1] + vr(s+4)[0]
OP67:    for s = 0 to 1   reg(s+8) = reg(s)-reg(s+4)
OP68:    for s = 2 to 3   reg(s+8) = reg(s+2)-reg(s+4)
OP69:    for s = 0 to 1   edge[4*i'+s,j] + reg(s+8)*reg(s+8) > reg(12)
OP70:    for s = 2 to 3   edge[4*i'+s,j] + reg(s+8)*reg(s+8) > reg(12)
OP71:    for s = 0 to 1   remap vr(s)
OP72:    for s = 2 to 3   remap vr(s)
OP73:    for s = 0 to 1   remap vr(s+4)
OP74:    for s = 2 to 3   remap vr(s+4)
    end (j)
    ** END INNER-LOOP SOLVER CODE
end (i')
```

1451

SYSTEM AND METHOD FOR CREATING SYSTOLIC SOLVERS

FIELD OF THE INVENTION

This invention relates in general to computer systems, and in specific to a system and method for creating systolic solvers.

DESCRIPTION OF THE RELATED ART

Application-specific solvers have been constructed in multiple forms. They have been constructed as ASICS where circuitry that is specialized to a specific application is used to design a custom chip to accelerate that application. Field programmable gate arrays (FGAs) offer an alternative approach where an application-specific circuit can be configured as programmable logic within a pre-existing chip.

FIG. 1 depicts a flow chart 100 for processing a program into a chip design. The flow chart 100 begins with a computer program 101, which is processed by compiler 102 into intermediate code 103. The compiler performs typical compiler operations such as control flow analysis, data flow analysis, etc. The compiler may also perform optimizations such as dead code elimination, strength reduction, etc. The intermediate code 103 is then processed through functional unit (FU) allocation, scheduling, and hardware (HW) synthesis. In FU allocation, logical devices, e.g. adders, multipliers, etc., are selected to perform the instructions of the intermediate code 103. The amount of logical devices allocated is typically the minimum needed to perform the tasks. During scheduling, the operations of the intermediate code are scheduled onto the selected functional units at particular time intervals. During HW synthesis, the selected functional units are formed into a layout and connected together according to the schedule. The result is a net list 105 that represents layout of the physical hardware device that performs the operations of the program 101.

A particular use for this process is to form a hardware accelerator that performs the functions of a nested loop of code. The accelerator is a non-programmable piece of hardware that efficiently performs the functions of the nested loop of code. Processing nested loop code can be very time consuming, as inner loops must be processed repeatedly for each increment of an outer loop. Thus, a hardware accelerator can quickly perform the same task for the cost of a small amount of chip area.

Accelerators produced by the process of FIG. 1 may employ spatial loop unrolling. This technique is used to unroll one or more loop dimensions in order to create an array of solvers. In those cases where each of the unrolled iterations maybe legally performed in parallel, a dedicated hardware accelerator may be used to perform the calculations for each of the spatially unrolled iterations in parallel. Note that the accelerators produced by the process of FIG. 1 are homogeneous in nature.

BRIEF SUMMARY OF THE INVENTION

One embodiment of the invention is a method for forming a solver for a loop nest of code, the method comprising forming a time and space mapping of a portion of the loop nest, performing at least one optimization that is dependent on the time and space mapping to the portion of the loop nest, and forming a solver from the optimized portion of the loop nest.

Another embodiment of the invention is a system for forming a solver for a loop nest of code comprising means for forming a time and space mapping of a portion of the loop nest, means for performing at least one optimization that is dependent on the time and space mapping to the portion of the loop nest, and means for forming a solver from the optimized portion of the loop nest.

Another embodiment of the invention is a computer readable medium having computer program logic recorded thereon for forming a solver for a loop nest of code, the computer program logic comprising logic for forming a time and space mapping of a portion of the loop nest logic for performing at least one optimization that is dependent on the time and space mapping to the portion of the loop nest and logic for forming a solver from the optimized portion of the loop nest.

BRIEF DESCRIPTION OF THE DRAWINGS

FIGS. 4A and 4B depict examples of spatial strip mining according to one embodiment of the invention.

FIG. 5 depicts an example of code after time mapping and spatial strip-mining according to one embodiment of the invention.

FIGS. 6A and 6B depict an example of promotion according to one embodiment of the invention.

FIG. 7 depicts an example of placement of the code of FIG. 6B according to one embodiment of the invention.

FIGS. 8A–8C depict examples of reduction according to one embodiment of the invention.

FIGS. 9A–9C depict examples of common subexpression elimination according to one embodiment of the invention.

FIG. 10 depicts an example of matrix multiple code.

FIGS. 11A–11F depict an example of one embodiment of the invention operating with the code of FIG. 10.

FIGS. 12A–12E depict another example of one embodiment of the invention operating with the code of FIG. 10.

FIG. 13 depicts an example of Sobel code.

FIGS. 14A–14G depict another example of one embodiment of the invention operating with the code of FIG. 13.

FIG. 15 depicts a block diagram of a computer system which is adapted to use one embodiment of the present invention.

DETAILED DESCRIPTION

Figure 1:
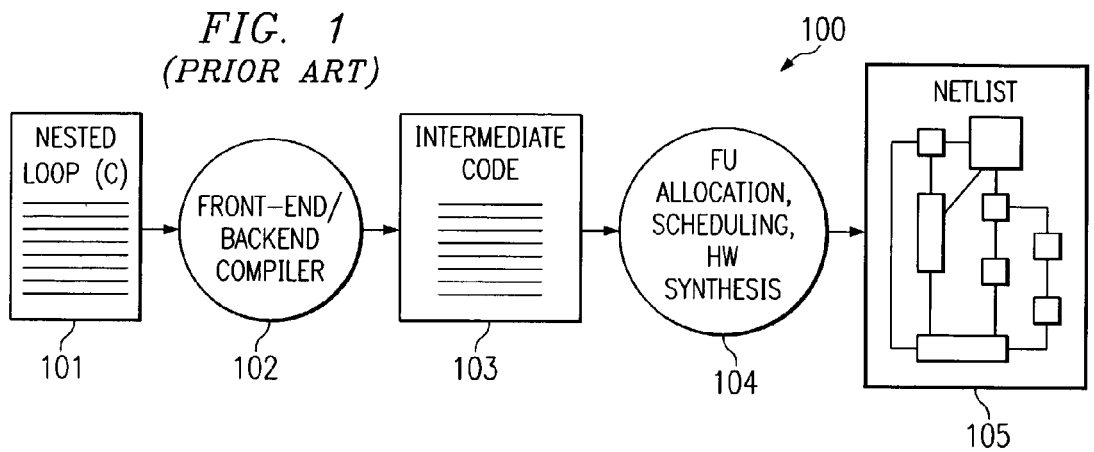
FIG. 1 depicts a flow chart for processing a program into a chip design according to the prior art.

The invention optimizes computer programs, including programs that contain one or more loop nests. The invention identifies one or more efficient manners to execute the loops, as measured in terms of cost-performance. The results of the invention can be used to design custom hardware to efficiently execute the program. The results may also be used to generate a modified and/or new program to efficiently execute loop nests on appropriate programmable or reconfigurable processor(s). The invention may operate with different hardware architectures, e.g. FPGAS, VLIWs, MIMDs, RISCs, custom logic, etc.

When the program includes one or more loop nests, the invention preferably optimizes the loop nest such that portions of the loop nest execute in parallel. High performance in nested loops often requires parallel execution of loop iterations. The invention provides a parallel schedule that reorders the execution time of loop iterations from their original sequential specification and executes multiple loop iterations in parallel. Note that running multiple loop iterations in parallel often requires more hardware resources. The invention simplifies the hardware needed to achieve a particular performance by reordering the operations of the loops.

The invention generates a heterogeneous family of efficient solvers for a given loop nest. A solver is a design that is represented in either hardware or software that may be implemented to execute the loop. For example, a solver may be a netlist for a hardware instantiation of the loop. Each solver in the family may be different from the other solvers and corresponds to specific choice for the spatial (on which processor) and temporal (at what time) organization of the application code. The different family member may be tested, and the best solver for a particular situation may be selected for use.

During the creation of the family of solvers, the invention preferably reorganizes the given loop nest code to explore differing organizations of the code in time and/or space. In node 203, a loop nest is permuted using a technique called inner outer loop exchange. This technique changes the order of processing for the loop code and specifies an innermost time iteration that will run on one or more processors. Some loop permutations properly execute source code and are legal, and some loop permutations are illegal and cannot be considered.

In node 206, parallelism is enhanced through the introduction of a space loop surrounding each of the operations within the body of the loop. Thus, the space loop is distributed over all of the operations in the body of the loop. The space loops iterate over spatial iterations that are processed in parallel. After inner outer loop exchange and the introduction of the space loops, a time mapping and a space mapping have been determined that specify, for each iteration of the original loop, when and where that iteration is performed. Note that in general, time mapping and space mapping may occur in either order or could be performed jointly.

The loop-nest after space-time mapping has two iteration types. A temporal iteration corresponds to a single iteration of the time loop. This represents a virtual time step that solves a single temporal iteration of the program. Within a temporal iteration, multiple operations are typically performed. Initially, the code is spatially symmetric and all spatial iterations have identical code. Each operation is surrounded by a spatial loop that iterates over space with index s that ranges from zero to P−1. These spatial loops are viewed as a static expansion of virtual hardware. If a single value is fixed for s, a spatial iteration is all of the code within a temporal iteration that is emitted by a spatial loop having that value for s. When the code is in its fully symmetric form, immediately after the identification of the time and space loops, spatial iterations are clearly defined for all operations.

The invention will preferably apply optimizations and transformations that make code spatially asymmetric. To allow this, code that loops over space is viewed as if it is unrolled so that an optimization may be applied to some spatial iterations without applying that optimization to others. Optimizations may be applied as if the code is fully unrolled, and no symmetry is required. When each optimization is applied, spatial loops are partially unrolled to represent any required asymmetry. Loops are unrolled as little as possible to preserve symmetry that remains from the original code.

In addition, initially the loop-nest may have been temporally symmetric, i.e. the loop nest may have been perfect. The invention will also preferably apply optimizations and transformations that make the loop-nest temporally asymmetric. These optimizations may require a partial unrolling of the time loop.

After this space-time iteration schedule has been determined, the invention preferably performs one or more optimizations. Such optimizations may include promotion, load/store elimination, common subexpression elimination, and the optimization of associative reductions (e.g. temporal and/or spatial common subexpression elimination).

Data is promoted when it is relocated from a remote RAM that is more distant from the hardware that references the data to a local RAM that is closer to that hardware (where distance, for example, could be measured in terms of number of levels in a memory hierarchy). Promoted data may be repeatedly referenced with greater efficiency by accessing the local RAM. When data is promoted, correct program operation may require copying initial data from the remote RAM into the local RAM and also may require that final data must be copied from the local RAM back to the remote RAM. Promotion may introduce both temporal and spatial asymmetry.

In conjunction with promotion, data may also be placed within multiple local RAMs. For example, a single array may be carefully placed within a number N of local RAMs, so that the hardware executing each of P spatial iterations may reference distinct local RAMs. The data is placed so that when a load or store operation accesses a local RAM, it can be guaranteed that it can access any data that must be referenced. This allows the construction of efficient accelerators that allow highly parallel memory access while utilizing multiple independent RAMs with fewer ports rather than a single RAM with more ports. Placement may also allow the replication of data. For example, if a single lookup table (e.g. an array that is read-only) is read within a loop nest, it may be promoted into multiple independent local RAMs for efficient parallel access. This may require that this table be replicated into each local RAM.

In one realization, placement is divided into a multi-phase process. In the first phase, arrays are potentially distributed. In this process, a single array (e.g. array A) is split into multiple arrays (e.g. one array for each of four spatial iterations A1, A2, A3, and A4). This distribution process transforms an array that is accessed by many operations into multiple arrays each having fewer operation accesses. In order to represent multi-dimensional arrays within a linear memory structure, all arrays should be linearized. A reference into the original array (for example of the form A(i,j,k)) is transformed into a reference into one of the distributed arrays (for example of the form A1 (index)) where the index has an appropriate value for each selection of values for i, j, and k. A final phase of placement packs each of the distributed and linearized arrays into physical RAMS. Here, two distinct arrays may be placed into a common RAM where desirable.

Load elimination and common subexpression elimination are optimizations that first recognize that multiple operations (e.g. two loads) produce a common value. After this is proven, one of the operations (loads/expressions) is eliminated and its value is obtained from a register as the result produced by the other operation (load/expression) that produces the equivalent value. This optimization can reduce the number of memory reference or arithmetic operations, while requiring that a previously computed value must be transmitted as an operand for re-use. Load elimination and common subexpression elimination can be applied to operations across spatial iterations. For example, when two load operations produce the same value in two spatial iterations one could be eliminated from one spatial iteration and its value can be provided within a register as the result produced by the load in the other spatial iteration. Hence, the two spatial iterations still execute in parallel, but they are no longer identical. The code for the first iteration has a load, while the code for the second iteration does not. The resulting temporal iteration is spatially asymmetric.

The optimization of associative reductions may be used as a component of this invention. This involves two main objectives. Consider an associative reduction in the body of a loop such as: sum=sum+x(i) where the value of the subscript i is incremented with each loop iteration. Conventional optimization requires that the sequence of values computed within the variable sum must exactly match the sequence as prescribed within the source program. The use of the associative property can allow that all terms x(i) can be added into sum in any order as long as all terms are summed prior to a use of the variable sum after all accumulation is complete. Thus, optimization of associative reductions will allow that certain dependencies that carefully specify the sequence order of a reduction are ignored in this way, the compiler can pretend as if the order of summation does not matter. Finally, the optimization of associative reductions requires that appropriate hardware be generated to correctly accumulate each of the required terms prior to the first use of the final sum.

Each of these techniques can change the number of needed memory or arithmetic operations, the number of storage elements needed to execute the code, and/or the nature of the dependencies among iterations.

These optimizations are performed by jointly analyzing and transforming code within adjacent temporal and spatial iterations. Temporal iterations are adjacent if they have been scheduled sufficiently close in time (temporal adjacency). Spatial iterations are adjacent if they are sufficiently close in space (spatial adjacency). Spatial distance can be defined in any arbitrary manner. For example, all spatial iterations can be considered adjacent, or alternatively, only neighboring spatial iterations can be considered adjacent (e.g. for iteration s, then s−1 and s+1 are its neighbors). Such optimizations result in two effects. First, spatial adjacency causes common subexpressions to be eliminated from some spatial iterations but still executed on others, creating spatial asymmetry. This spatial asymmetry may yield asymmetry in the resulting solver. For example, the processor that executes the spatial common subexpressions may have a different hardware mix than the processor that executes the rest of the code. For example, in the final inner-loop solver, processor A might perform a load from memory and transmit the results through registers to processors B, C, D, all of which are identical to each other but different from processor A.

It is sometimes beneficial to preserve spatial symmetry. For example in one common situation, the inner time loop consists of unique code for one spatial iteration and identical code for N spatial iterations, where N>1. In this case, the N symmetric spatial iterations can be expressed with a single body of code instead of N bodies of code. This single body of code is optimized, scheduled, and synthesized, and then finally replicated as identical hardware processors. In this way, it can be guaranteed that symmetric spatial code results in symmetric hardware accelerators. These symmetric accelerators may share control logic because of the identical nature of their operation. The asymmetric spatial code should be implemented by a single non-replicated processor since its code is unlike the symmetric code.

Alternatively, all spatial iterations may be treated separately as a non-replicated processor. In this case, the scheduling and hardware synthesis process may not preserve any symmetry present within the original code. This provides a benefit, namely the ability to schedule operations from multiple spatial iterations on a single function unit, and has a cost, namely the loss of symmetry in the final hardware structure. A custom solver is produced where the spatial iterations may not have identical schedules and thus, may not have equivalent hardware structure. While the solver is still efficient, the symmetry of the original code has been lost and additional control complexity may be required for this machine.

The second effect is caused by temporal adjacency. In a very similar manner, a temporal iteration might reuse a common subexpression that was calculated in a prior temporal iteration. However, the first iteration has no prior iterations. When inter-iteration common subexpression elimination is performed, special out-of-loop code is introduced to compute any subexpression, needed by the first few temporal iterations, when they should have been computed by prior (non-existent) iterations. This process systematically identifies code that rarely executes, and these operations are removed from the inner-loop code and placed out-of-loop. The introduction of out-of-loop code makes the loop-nest temporally asymmetric. This extracted code executes outside of the iteration schedule and hence requires its own out-of-loop program schedule. Because it executes rarely, the resulting solver looks to have an occasional temporal hiccup, when the control falls briefly from the inner-loop iteration schedule to the out-of-loop schedule.

After time-space mapping and optimizations, symmetry detection is performed. This process involves identifying the symmetry of operations and then maintaining such symmetry during hardware allocation and scheduling. The resulting hardware solver is more modular.

Symmetry clusters or clusters are used within an embodiment of this invention to create identical hardware units having identical program schedules. This simplifies hardware and allows a single hardware controller to control multiple identical clusters. During optimization, hardware symmetry is preserved by maintaining (or partially maintaining) spatial loops. When important optimizations introduce asymmetry, spatial loops are unrolled exactly as needed to allow them.

A symmetry recognition phase performs additional spatial unrolling as necessary to place the code in a final form that allows a mapping of all operations into clusters. Each operation within the final code resides within a spatial loop or it lies outside all spatial loops. Each spatial loop has known constant bounds and its constant trip count can be evaluated. Operations outside any spatial loop have a spatial trip count of one.

During cluster assignment, each operation is assigned to a cluster having a replication factor that matches its spatial trip count. Multiple operations can be assigned to a single cluster as long as they have a common spatial trip count. After cluster assignment is complete, function unit hardware will be allocated to each cluster separately. First, the cluster's spatial trip count is ignored, and hardware is optimally allocated to support a single instance of the cluster's operations at the given initiation interval (II). Each operation within a cluster is scheduled exactly once. This operation represents a potentially replicated family of operations that are scheduled simultaneously. The cluster will be replicated (as many times as the cluster replication factor) during hardware synthesis to accommodate the fact that a single cluster may support operations for multiple spatial iterations.

After cluster assignment, hardware resources are assigned to the operation clusters and the code is scheduled. While functional unit allocation is performed once for each operation cluster, a single joint application of modulo scheduling is used for all operations. Note that prior techniques exist that use Boolean predicate guards to allow out-of-loop code to be moved back into the body of the loop and conditionally executed within a perfect loop nest. These techniques allow out-of-loop code to be allocated and scheduled much like the in-loop code that executes on each loop iteration. However, when this is done, a small number of iterations (e.g. the first iteration) may execute a few extra operations (e.g. a memory load operation). But, the static loop schedule should accommodate this additional load, as if it occurs on every iteration. Alternatively, because out-of-loop code executes so infrequently, it is preferable to use a separate out of loop schedule for out of loop code.

The invention then preferably allocates hardware for any out-of-loop code and also schedules the out-of-loop code. The invention takes the results of the FU allocation and scheduling for both inner-loop and out-of-loop code, and generates a hardware and/or software description for the overall solver. As stated earlier, the solver may be a software entity and/or a hardware entity. For a software solver, the final solver is preferably code for a pre-existing hardware processor that when executed, performs the functions of the solver. For a hardware solver, the final solver is preferably a layout in a hardware description language that represents the final solver artifact.

The effectiveness of the solver for the candidate iteration schedule is evaluated in terms of hardware cost and performance. Similarly, solvers for other iteration schedules can be selected, optimized, and evaluated. Thus, the invention provides a systematic manner for generating a family of highly optimized solvers for executing the selected code. A best solution can be selected from this family of efficient solvers.

Figure 2:
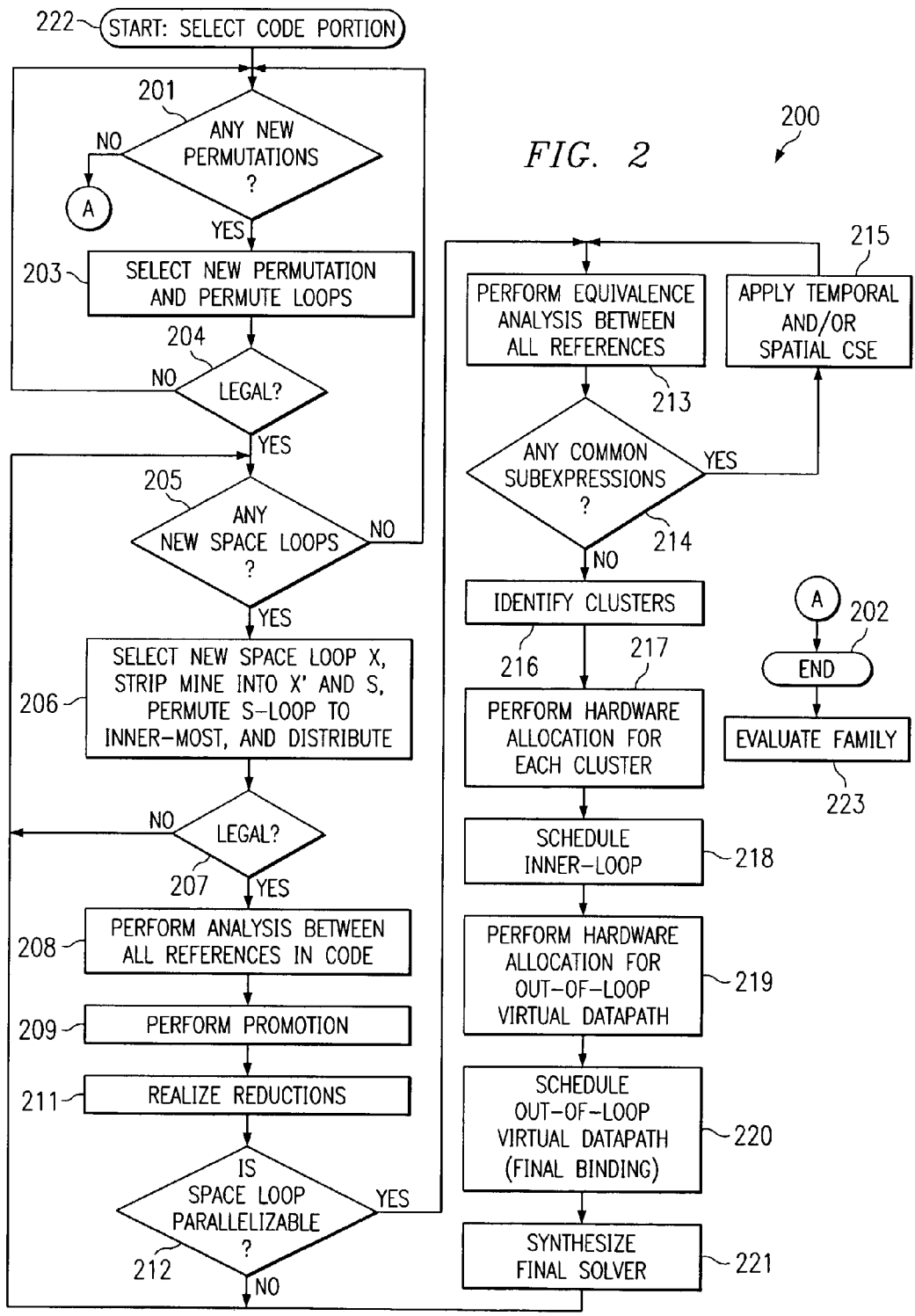
FIG. 2 depicts a flow chart for a preferred manner of operation of one embodiment the invention.

FIG. 2 depicts a flow chart for a preferred manner of operation 200 of the invention. Note that other arrangements are possible and the specific arrangement shown in FIG. 2 is by way of example only. For example, the arrangement shown in FIG. 2 has the time mapping being selected first, and then the space mapping selected second, however, the invention would operate with the space mapping being selected first and then the time mapping being selected second.

The invention begins at the start node 222 with a selected portion of program code, for example a nested loop. The invention determines whether any other time mappings of the code can be formed 201. If not, then the invention ends 202. If so, then the invention selects a new permutation of the loops and permutes the code 203. Note that the determination does not need to be exhaustive, the number of iterations may be pre-set, and/or the types of permutations may pre-set to a limited group. Also note that the code need not be perfect. If a loop interchange is proposed that must cross out-of-loop code, that code could be pushed towards the inner-most loop, via perfectization, or pushed toward the outer-most loop, via loop distribution. Alternatively, loop interchange across imperfect code could be disallowed.

Figure 3A:
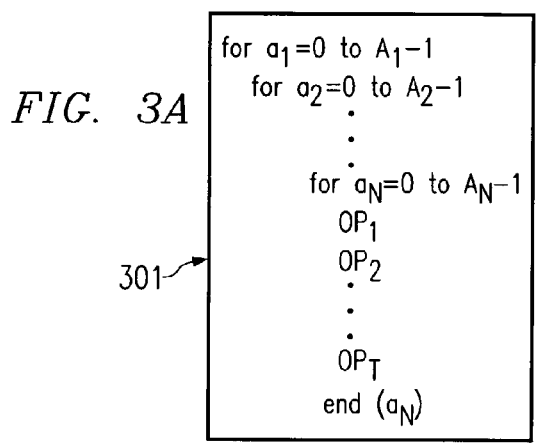
FIGS. 3A and 3B depict examples of time mapping according to one embodiment of the invention.
Figure 3B:
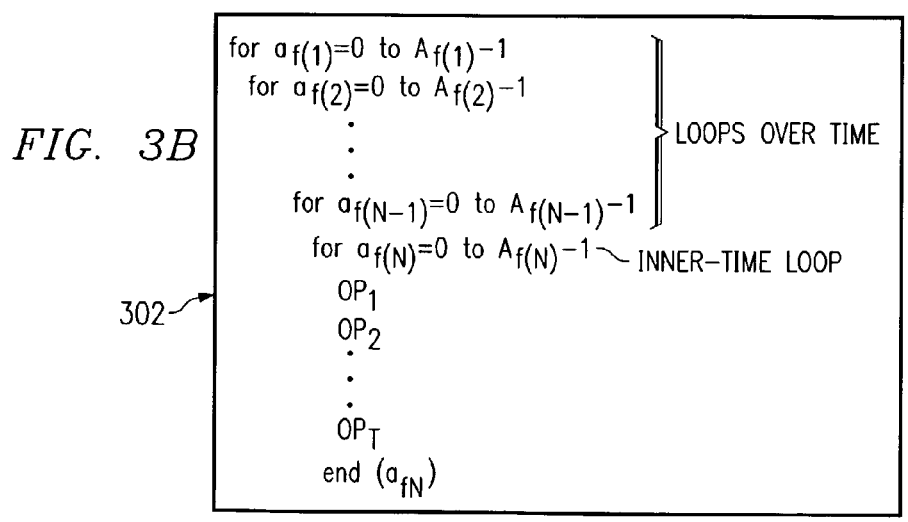

An example of time-mapping is shown in FIGS. 3A and 3B. FIG. 3A depicts a portion of code 301, specifically a loop nest that is N deep with T operations in the inner-most loop. Note that the total trip count for the loop nest is A1 times A2 times . . . AN.

FIG. 3B depicts code 302 that is a time mapping of the code 301, wherein f is a permutation of 1 . . . N. Thus, code 302 has a different ordering of the loops. For example, in the code 301, the outermost loop is over A1, in the permuted code 302, the outermost loop may be A2. As another example, the innermost loop is over AN, while in the permuted code 302, the innermost loop may be A1. Thus, f describes the permutation that has been selected. Note that the total trip count for the permuted loop nest is the same as for code 301, and the number of operations T has not changed.

The invention then determines whether the selected permutation is legal 204. If not, then a new permutation is selected (if any) 201, and if so, then the invention continues with space mapping 205. Legality ensures proper operation of the permuted code.

For example, one type of legality check uses dependencies. A dependence describes a relation between an operation that computes a value and another operation that uses that value. Normally, dependencies must remain forward in time, that is, the value must be computed before it can be used. The code before time mapping specifies an ordering (the sequential loop execution order) under which operations produce and consume data—that is, this ordering defines the dependencies of the loop. The legality test should verify that after time mapping these dependencies are not violated that is, in the loop ordering of the code after time mapping, no value is consumed prior to it being used. In the preferred realization, node 204 uses dependencies for legality checking. If any dependencies are violated, node 204 determines if the violated dependencies are associative. If so, these dependencies are marked for later fix-up in node 211, and node 204 returns legal. If any of the violated dependencies are not associative, node 204 returns illegal.

Some arithmetic operations (such as summation) are associative and the order of a summation can be reorganized using the associative property of arithmetic. Consider, for example, a statement like s=s+x(i,j,k) that might be used to sum all elements of a matrix x into the scalar s. A naïve (non-associative) treatment of this statement would insert a dependence from each iteration that computes s to exactly the next iteration that recomputes s (where it is again used). All iterations are sequentially linked and any attempt to permute the statement order would normally be illegal. However, if the use of the associative property is allowed, these statements can be added in arbitrary order. This can be accomplished by special handling of certain dependencies that unnecessarily constrain the summation order.

The invention then determines whether any other space mappings of the code can be formed 205. If not, then the invention elects a new space mapping and applies it to the code 206. Note that the determination does not need to be exhaustive, the number of iterations may be pre-set, and/or the types of mappings may pre-set to a limited group.

Space mapping is preferably performed by the process of spatial strip-mining. Spatial strip-mining determines which iterations of a loop nest execute in parallel. In the preferred method, the spatial strip-mining process identifies a set of candidate loops from which the parallel iterations will be determined. These candidate loops are peeled, unrolled, and/or strip-mined to obtain the required parallelism. In the preferred method, the strip-mining is applied to each operation in the innermost loop by means of a fixed trip count for-loop. For example, the candidate loop "for j=1 to 80 {OP1 OP2}" could be transformed to "for j'=1 to 20 {for s=1 to 4 OP1; for s=1 to 4 OP2;}". As part of space mapping, scalar expansion is applied to any scalar that is always written in the loop prior to being read. This is a standard technique to handle intra-iteration dependencies through temporary variables. In this example above, if OP1 was "a=x[i]*y[i]" and OP2 was "z[i]=a*a", then the inner-loop would become "for s=1 to 4 a[s]=x[i]*y[i]; for s=1 to 4 z[i]=a[s]*a[s]". This handles the intra-iteration dependence through s by carrying four multiply results from OP1 to OP2 instead of one.

As with the time mapping, any spatial strip-mining needs to be checked to ensure legality 207. The code given as input to spatial strip-mining specifies an ordering of the iterations under which operations produce and consume data—that is, this ordering defines the data flow of the loop. The legality test must verify that the data flow after spatial strip-mining matches the original data flow—that is, no value can be consumed prior to it being produced. This first test can be verified in the same way as legality test 204. If this first test returns illegal, then node 207 returns illegal. However, if this first test returns legal, then legality test 207 has an additional requirement in the preferred method. In the execution ordering of the code after spatial strip-mining, each operation has P consecutive copies, where P is the parallelism of the spatial strip-mining. The legality test 207 also verifies that there are no dependencies within a set of P consecutive copies of an OP. This dependence is called a spatial self dependence. If all spatial self dependencies are associative, then these dependencies are marked for later fix-up in node 211, and node 207 returns legal. If there are any non-associative spatial self dependencies, node 207 returns illegal. This preferred definition of spatial strip-mine legality not only ensures proper operation of the spatially strip-mined code but also ensures that the requisite parallelism will be available in the symmetric code. Other more relaxed definitions of legality 207 are also possible.

If the code is not legal, then a new spatial strip-mining is selected (if any) 205, and if so, then the invention continues with analysis 208.

FIGS. 4A and 4B depict examples of a space mapping. FIG. 4A depicts a portion of code 401, specifically a loop nest that is N deep. FIG. 4B shows a possible result 402 of spatial strip-mining the k-th loop 403. The trip count of the k-th loop is reduced by a factor of P, and a new loop is added to each operation with trip count P.

The P term in the code of FIG. 4B is the parallelism of the spatial strip-mining. In the inner loop 405, each operation has a spatial loop trip-count of P, while the residual loop 404 of the candidate loop has a trip count of $A_k/P$. Note that, as of yet, no hardware resources have been defined. Note also that a different spatial strip-mining may have chosen different candidate loops, different ways to obtain the strip-mining (e.g. blocking or interleaving), or combinations thereof. Note that in this example, P divided $A_k$ evenly. There are standard techniques to handle the strip-mining for when P does not divide $A_k$ evenly.

After completion of node 207, the code has been time-space mapped. Note that as described earlier, loop interchange and spatial strip-mining can be applied in either order. An example of code that has been time-space mapped is shown in FIG. 5. The code 501 comprises two portions, an inner loop solver 502 (which contains a P trip-count spatial loop for each operation and the innermost time loop), and the portion 503 outside of the inner loop solver code. The invention then processes this code to develop a virtual data path for the operations in the inner loop solver code 502.

After completion of the virtual space-time mapping, the invention performs analysis of the code to determine which optimizations can be performed on the code 501 via node 208. The invention analyzes the relationships between the references in the code. If there are no optimizations that can be performed, then the invention skips nodes 209 and 211. Otherwise the invention proceeds through nodes 209 and 211, as needed and skipping unnecessary optimizations.

At node 209, the invention performs promotion, if possible. Promotion attempts to reduce the number of accesses to distant memory by allowing data to be accessed from memory resources closer to the hardware, such as local RAM and registers. Promotion has been separated into array relocation shown in FIG. 6B and placement shown in FIG. 7. Initially, data referenced in the code, including variables and arrays, is assumed to be in global memory. To eliminate redundant accesses to global memory, data may be promoted (stored) to local memory and/or registers. The promotion code is inserted at a location in the loop nest which reduces the memory traffic. A heuristic preferably selects where the promotion should occur, after evaluating the benefit of the promotion. The heuristic would preferably also determine the level in the memory hierarchy the data should reside, e.g. registers, or a location in a virtual local memory hierarchy.

FIG. 6B illustrates array relocation as the array C (stored within global memory) shown in 6A is relocated to a local memory C' shown in 6B. It may be expensive to simultaneously access a single local memory (e.g. C') by P distinct spatial processors. Thus, placement segregates a single local memory into multiple local memories that can more easily satisfy parallel access needs. For example, the relocated code 602 of FIG. 6B could be placed as shown in FIG. 7. In the placement code 700, references to C' have been replaced with references 701, 702, 703 to lmem(s)[ ], which represents accesses to one of P distinct local memories (one per spatial processor). In the example shown in FIG. 7, each local memory reference specifies the index of the referenced local memory with statically known spatial index s. Note that the notation lmem(s) is not implemented as a dynamic indexing since s (for each spatial processor) is a known constant. Instead, this refers to a static connection between the memory reference generated by one of P spatial processor and one of P local memories that are accessed by that reference. This relationship need not be one-to-one. For example, pairs of spatial processors might access a common local memory.

In the preferred realization, promotion 209 is performed after time mapping 203, spatial strip-mining 205, and legality checking 204 and 207. An example of promotion is shown in FIGS. 6A, 6B, and 7. FIG. 6A depicts a block of code 601 that has been time and space mapped and checked for legality. The inner loop code 603 comprises two references to a four-dimensional array C, a read and a write. For the purpose of this and subsequent examples, it is assumed that all arrays references are well-defined, e.g. the array bounds are never exceeded for any index. Promotion can be broken down into two parts: array relocation and placement. Array relocation creates one or more new arrays to hold portions of the original array and inserts the appropriate copy code between the arrays. FIG. 6B depicts the post array relocation code 602 after applying the array relocation transformation to the code 601 of FIG. 6A. Code 602 includes an initialization loop 604 that copies portions of the array C to relocation array C'. Note that C' is two-dimensional and is only indexed by $a_5$ and s. The inner loop 605 now only references C'. The relocation finalization loop 606 writes the results from C' back into C. Note that there is preferably not a legality step after promotion. Instead, promotion is preferably applied in a way that guarantees correctness. That is, if the input to promotion is legal code, then the output of promotion will be legal code.

The size and dimensionality of the relocation arrays, as well as the location of the copy code, can be determined by a set of heuristics. For example, since lowering the required bandwidth to distant RAMs often yields higher performance and/or lower cost, one heuristic is to reduce the number of accesses to distant RAMs. In FIG. 6B, the accesses to C are reduced such that each location is accessed only twice, namely once for the first read (live-ins) and once for the final write (live-outs). This reduces the number of accesses to C from twice A1*A2*A3*A4*A5*P, which is the total number of iterations in the loop-nest 603, to twice A1*A2*A5*A*P. Note that the total number of memory accesses to both C and C' has increased in FIG. 6B. However, accesses to C' will be faster and/or cheaper than accesses to C, assuming C' is placed in RAM that is closer to the hardware than the RAM that holds C. Note that at this point, no virtual or physical hardware such as RAM and/or registers has been created for the relocation arrays.

At node 211, the invention realizes reduction, if appropriate. A reduction transformation re-associates associative operations such that the final hardware generates correct results. This re-association may create temporal out-of-loop code and/or asymmetric inner-loop code. The legality checks 204 and 207 recorded all associative dependencies that were violated and require fix-up. For example, consider the spatial loop "for s=1 to 4 foo=foo+3*x[s]". This operation has a spatial self-dependence since the new value of foo depends on the previous value. Because the + was associative, legality test 207 returned legal but marked this dependence a spatial self dependence that must be fixed. To eliminate such problematic dependencies, node 211 could rewrite the code as the symmetric operation "for s=1 to 4 temp[s]=3*x[s];" followed by the single asymmetric operation "foo=(temp[0]+temp[1])+(temp[2]+temp[3]);" Thus, the chain of dependencies across spatially symmetric code is eliminated. This optimization can be applied to any associative operation. While the chain of spatial dependencies has been eliminated, in some cases a chain of temporal dependencies may still exist which may reduce performance. A technique called recurrence height reduction may be used to reduce the height of this chain of temporal dependencies. For example, see "Acceleration of First and Higher Order Recurrences on Processors with Instruction Level Parallelism," M. Schlansker, et al., Sixth Annual Workshop on Languages and Compilers for Parallel Computing, Portland, Oreg., Aug. 12–14, 1993, which is hereby incorporated herein by reference. In addition, to handle associative dependencies which were violated by time mapping and identified in node 204, some out-of-loop code may be required to perform a final sum of partial sums that were computed by the inner-most loop.

For example, some reduction transformations of node 211 may take the code 801 in FIG. 8A and produce the code 802 in FIG. 8B, where the finalization loop might be used to perform a summation of partial sums. Also, some reduction transformations may take the code 801 in FIG. 8A and produce the code 803 in FIG. 8C, where asymmetric code is added to the inner-loop that might compute a summation tree of partial sums which were computed by symmetric inner-loop code.

At node 212, the invention determines if the optimized code is can indeed be implemented in parallel manner. In node 206, the code was spatially mapped for parallel processing. If node 212 determines that the inner loop code cannot be parallel processed, then the invention discards the current code and returns to node 205 for a new spatial strip-mining, if any. Otherwise, the invention continues processing the current code at node 213.

The invention then performs equivalence analysis, including memory analysis between all references via node 213. This step uses alias analysis to determine which references may alias and, if possible, to determine under what conditions the aliasing occurs. Two references alias if they might access the same location in memory. Node 213 is used by subsequent nodes to obtain more optimal solvers. For example, if two references to the same array never alias, then it may be possible to implement the array in two physical memories each with half the bandwidth than what would have been required by a single shared memory.

Based on the analysis of node 213, the invention then determines whether there are any common subexpressions in the code, via node 214. This includes expressions that are common across temporal iterations, as well as those expressions that are common across spatial iterations. This transformation is attempting to reduce redundant operations, including loads and stores. If there are no common subexpressions, then the invention proceeds with node 216. If there are common subexpressions, then the invention proceeds with node 215. See "Data Flow and Dependence Analysis for Instruction-Level Parallelism," by B. R. Rau, Fourth Annual Workshop on Languages and Compilers for Parallel Processing, Springer-Verlag, 1992, pp. 235–250, and "Dependence Graphs and Compiler Optimizations," by David J. Kuck, et al., POPL, 1981, pp. 207–218, both of which are hereby incorporated herein by reference.

The invention applies temporal and/or spatial common subexpression elimination routines, as appropriate, if node 214 determines that the code includes common subexpressions. Temporal common subexpression elimination (CSE) attempts to eliminate expressions that are common across temporal iterations. The resulting expressions are stored between successive iterations in expanded virtual registers (EVRs), the depth of which is determined by the temporal distance between the times at which the expressions are equivalent in the virtual schedule. EVRs are a mechanism to simplify the code after optimizations. EVRs have been described in [HPL-94–115, November 1995, "Iterative Modulo Scheduling," B. Ramakrisha Rau, (HP Labs Technical Report), hereby incorporated by reference herein. An EVR is a linear array of registers with a special operation "remap." A remap operation shifts all of the values in the EVR. For example, if X is an EVR of size 4, then X[0], X[1], X[2], and X[3] refer to different registers, and a "remap(X)" operation is equivalent to the following set of copies: "X[3]=X[2]; X[2]=X[1]; X[1]=X[0]."

The virtual registers created during temporal CSE must be valid at the beginning of the loop-level in which the CSE occurred, and hence out-of-loop code is required to initialize their states (for example, X[2] should not be read before initializing it).

For loads and stores, temporal CSE reduces the number of access to distant memory by allowing data to be reused from memory resources closer to the hardware, such as registers. CSE also applies to computations such as adds and multiplies, in which a computation can be performed once, stored in a register, and then reused.

FIG. 9B depicts an example of temporal CSE being applied to the code of FIG. 9A. FIG. 9A includes a portion of code 901 that includes code 903. Node 213 has determined that code 903 includes subexpressions in different temporal iterations that compute the same value. Node 213 has also determined the iteration distance that equivalency holds. From this information, the invention can reform the code into the code 902 which is shown in FIG. 9B. The operations from code 903 has been transformed in code 905, wherein the common expressions have been replaced with code that is more efficient, e.g. a single expression. Code 902 includes initialization code 904 which creates the proper state for the operations of the inner loop 905, if necessary. Code 902 includes finalization code 906 which creates the proper state for operations outside of the inner loop 905, if necessary. For example, suppose the inner loop 903 contains an add operation ADD1 that is identical with an add operation ADD2 in the previous temporal iteration. The result of ADD2 could be stored in a virtual register and used in place of the ADD1. However, at the beginning of the loop there is not previous iteration and the virtual register is undefined. The code 904 would create the proper state for the inner loop 905 by performing the ADD1 operation one time and storing the result in the virtual register.

Spatial CSE attempts to eliminate expressions that are common across spatial iterations. Node 213 has determined that code 903 includes some subexpressions that are identical for certain values of s. From this information, the invention can reform the code into the code 908 which is shown in FIG. 9C. The code 903 has been transformed into code 909, 910, 911, 912, wherein the common expressions have been replaced with code that is more efficient, e.g. a single expression. Code 908 includes asymmetric code 909, 911 which creates the proper state for the operations of the symmetric code 910, 912, if necessary. For example, the inner loop 903 contains an add operation ADD1 that is identical with an add operation ADD2 when s is decremented. The result of ADD2(s−1) could be used in place of the ADD1(s) operation. However, when s=0, ADD2(s−1) is undefined. The asymmetric code 909 would contain an ADD1 operation for the case when s=0. Spatial CSE has thus eliminated P add operations (ADD1(s) for each value of s) and introduced one new add operation (asymmetric code ADD1(0) to handle the case where ADD2(s−1) is not defined), for a total savings of P−1 add operations. Note that node 213 may have found subexpressions for which both the temporal distance and the spatial distance are non-zero. In this case the invention could create both temporal out-of-loop code, as well as asymmetric inner-loop code.

After applying temporal and/or spatial CSE, the invention returns to node 213 and 214 to determine if other common subexpressions exist, if so then the invention applies temporal and/or spatial CSE as appropriate, if not then the invention proceeds to node 216.

After completion of the optimizations, symmetry detection is performed. In node 216, the clusters are identified. This process involves identifying the symmetry of operations and then maintaining such symmetry during hardware allocation and scheduling. This makes the resulting hardware solver more modular.

After cluster assignment, FU allocation is performed once for each cluster at the given initiation interval (II) in node 217. II is the number of cycles available to execute an iteration of the loop. If II>1, then sharing of hardware may be possible. For example, if II=2 and there are two ADD operations in an iteration, then it might be possible to execute both operations on the same physical adder. In general, FU allocation will allocate the fewest resources possible to execute the operations within a given cluster for a given II.

The invention next performs modulo scheduling of the inner-loop for the given II in node 218. Operations from all clusters are scheduled together, but operations can only be bound to FUs in the operation's cluster. Each symmetric operation is scheduled once, and then this schedule as well as the underlying FU allocation is replicated to form the final solver. The modulo scheduler is aware of this spatial replication while making its scheduling decisions. Note that there are several applications of FU allocation and only one joint application of scheduling. For example, say there were two clusters of symmetric operations and one cluster of asymmetric operations. There would be three applications of FU allocation, one for each cluster. This would be followed by one joint application of scheduling.

The invention then runs hardware allocation in node 219 for the out-of-loop code and scheduling in node 220 for the out-of-loop code.

Finally, in node 221, the invention takes the results of nodes 217, 218, 219, 220, of FU allocation and scheduling for both inner-loop and out-of-loop code, and generates a hardware/software description for the overall solver. As stated earlier, the solver may be a software entity and/or a hardware entity. For a software solver, the final solver is preferably code that when executed, performs the functions of the solver. For a hardware solver, the final solver is preferably a layout in a hardware description language that represents the final solver artifact.

After node 221, the invention returns to node 205 to determine if additional mappings exist for the space loop. If so, then the invention continues processing with node 206. If not, then the invention continues with node 201 to determine if additional time mappings exist. If so, then the invention continues processing with node 203. If not, then the invention ends 202 formation of the family of solvers.

After completion of the family, the invention may optionally evaluate the family to determine the best and/or most appropriate solver for predetermined criteria, via node 223. For example, this node may rate the benefits of a solver verses the costs of the solver in terms of cost, area, performance, resources used, efficiency, and/or power. Note that this evaluation could have been done earlier in the design flow to preemptively eliminate some candidate solvers.

Note that the invention provides a temporally heterogeneous and spatially heterogeneous family of solvers. The family is spatially heterogeneous as different members of the family may have different numbers of processors, as well as different types of processors. Also, the detailed design for each processor may vary across this family. Thus, some family members may comprise five processors, while others comprise 10 processors. Some family members may be a mix of asymmetric processors and symmetric processors, while other family members may be all symmetric processors. Some processors in a family member may comprise adders, while other family members may have processors that comprise adders and multipliers. These differences become apparent as distinct space time mappings are selected and optimizations are then performed that may depend upon the chosen space time mapping.

The family is temporally heterogeneous as different members of the family may have different orders for the time loop processing, as well as breaks or hiccups between time loop processing. Note that as with spatial heterogeneity, family members may have the same orders for loop processing, as well as the same (or no) breaks or hiccups as other family members. FIG. 6B depicts a break or "hiccup" in the time loop processing, in that initialization code 604 is placed between the time loops $a_2$ and $a_3$.

FIGS. 10–12 depict an example of the operation of the invention to form a family of solvers have two members. Note the invention may have operated to form different and/or additional family members. Further note that this code is used by way of example only as other code could be used.

FIG. 10 depicts a block of code 1001 that performs matrix multiplication. The code 1001 multiples the elements of array A and the elements of array B, and then adds the result with elements of array C, and then stores the result in array C. Note that the programmer has specified that the + operation is associative, which will allow the invention to apply associative reductions. Thus, this is the code 1001 that the invention operates on in FIGS. 11A–11F and 12A–12E. In FIGS. 11A–11F, the invention has selected the time loop order of i, j, k, and loop j has been selected as the space loop. In FIGS. 12A–12E, the invention has selected the time loop order of j, i, k, and loop k as the space loop.

In FIG. 11A, the invention has performed loop interchange such that the loop order is now i, j, k in code 1101. Note that code 1101 has the loop order of i, j, k.

After performing loop interchange, legality must be checked. The code 1001 has one operation and one dependence. OP1 is the operation in the inner-loop of code 1001. Note that OP1 for some settings of i,k,j depends on the value computed by a previous OP1, where previous is defined by the loop ordering. To be more specific, OP1@<i,k,j>depends on the result of OP1@<i,k−1,j>for k>0. The loop interchange from i,j,k to i,k,j did not violate this dependence since in the loop ordering of code 1101, OP11@<i,k,j>comes after OP11@<i,k−1,j>for k>0. Hence, this code passes the legality check, so the invention continues processing the code. Note that the fact that the dependence is associative was not needed by the legality checker for this particular interchange.

In FIG. 11B, the invention has selected the j loop for spatial strip-mining to produce code 1102. The parallelism has been selected to be 4, and j is transformed into 4j'+s where j' goes from 0 to N/4−1. Each operation in the inner loop (OP21 in this case) loops from 0 to 3 (which is P−1). Note that this is one possible strip-mining; other choices are possible such as j=4s+j'.

After applying spatial strip-mining, the code must be checked for legality. The code 1101 has one dependence, namely OP11@<i,k,j>depends on the result of OP11@<i,k−1,j>for k>0. The legality test 207 has two parts. The first determines if any dependencies are violated. After spatial strip mining, the dependence requires that OP21@<i,k,4*j'+s>comes after OP21@<i,k−1,4*j'+s>for k>0 in the loop ordering of 1102. This is true, and hence the first step in legality test 207 passes. The second part of legality test 207 checks that no dependencies exist between the sets of P consecutive operations. This is also true, and hence the code 1102 passes legality check 207, and the invention continues processing the code. Note that the fact that the dependence is associative was not needed by the legality checker for this particular spatial strip-mining.

After performing analysis of the references of the code, the invention determines that optimizations can be applied to the code.

In FIG. 11C, the code 1102 has been optimized by applying the first promotion, array relocation. In the resulting code 1103, the references to A, B, and C have been replaced with A', A", B', and C'. Also initialization and finalization code has been added. This is just one possible array relocation, many others are also valid. Note that array relocation can occur at different levels in the loop nest. For example, the copy code for relocation array B' is inserted before the outer-most loop. The copy code for A' was inserted between the i and k loops. The copy code for array C' was inserted between the j' and k loops. Also note that there can be multiple levels of promotion. In this example, A' was further promoted to A". The copy code for A" was inserted inside the inner-most loop.

The copy code for A" is asymmetric with respect to space, and hence array relocation can create both temporal out-of-loop code as well as spatially asymmetric code. Also note that the code 1102 was perfectly nested whereas the code 1103 is imperfect. This invention systematically creates out-of-loop code, both spatially and temporally, during its optimizations. Unlike other approaches, this out-of-loop code can appear anywhere within the loop nest—even at locations inside the scope of time-space mapping.

In FIG. 11D, the code 1103 has been optimized by applying placement to form code 1105. In this code, the relocated arrays have been assigned datapath structures lmem or reg, which stand for local memory and registers, respectively. For these examples, each type of data path structure has a unique numeric identifier. The notation lmem(s) is used to refer to the s-th virtual RAM, while the notation reg(s) is used to refer to the s-th register. For example, lmem(3) is the third virtual RAM. Note that if lmem(s) or reg(s) appears in the code, then the index s must have a static supper bound since these expressions are statically mapped to fixed resources. In other words, of one were to completely unroll the s-loops, every argument of lmem or reg would have an integer value. For example, in FIG. 1D, the code 1104 reflects such an unrolling of the code 1105 (FIG. 11E).

After performing placement, the invention realizes reductions (if any). Recall that nodes 204 with code 1101 and node 207 with code 1102 did not identify any associative dependencies that required later fix-up. Hence, no reductions were needed for this member of the family of solvers.

After realizing reductions, the invention checks to ensure that the code is parallelizable, performs equivalence analysis, applies temporal and/or spatial CSE (as appropriate). In this case, there were no opportunities for temporal or spatial CSE.

The invention then detects symmetry, and binds symmetric and asymmetric operations to clusters. The code 1105 has two operations, namely OP41 and OP42. OP41 is asymmetric (does not loop over s), and OP42 is symmetric (across all values of s). In one realization of symmetry detection, two clusters are created, namely {OP41} and {OP42}. Alternatively, the code 1105 could have been unrolled as in code 1104, yielding a single cluster of five asymmetric operations.

Figure 11F:
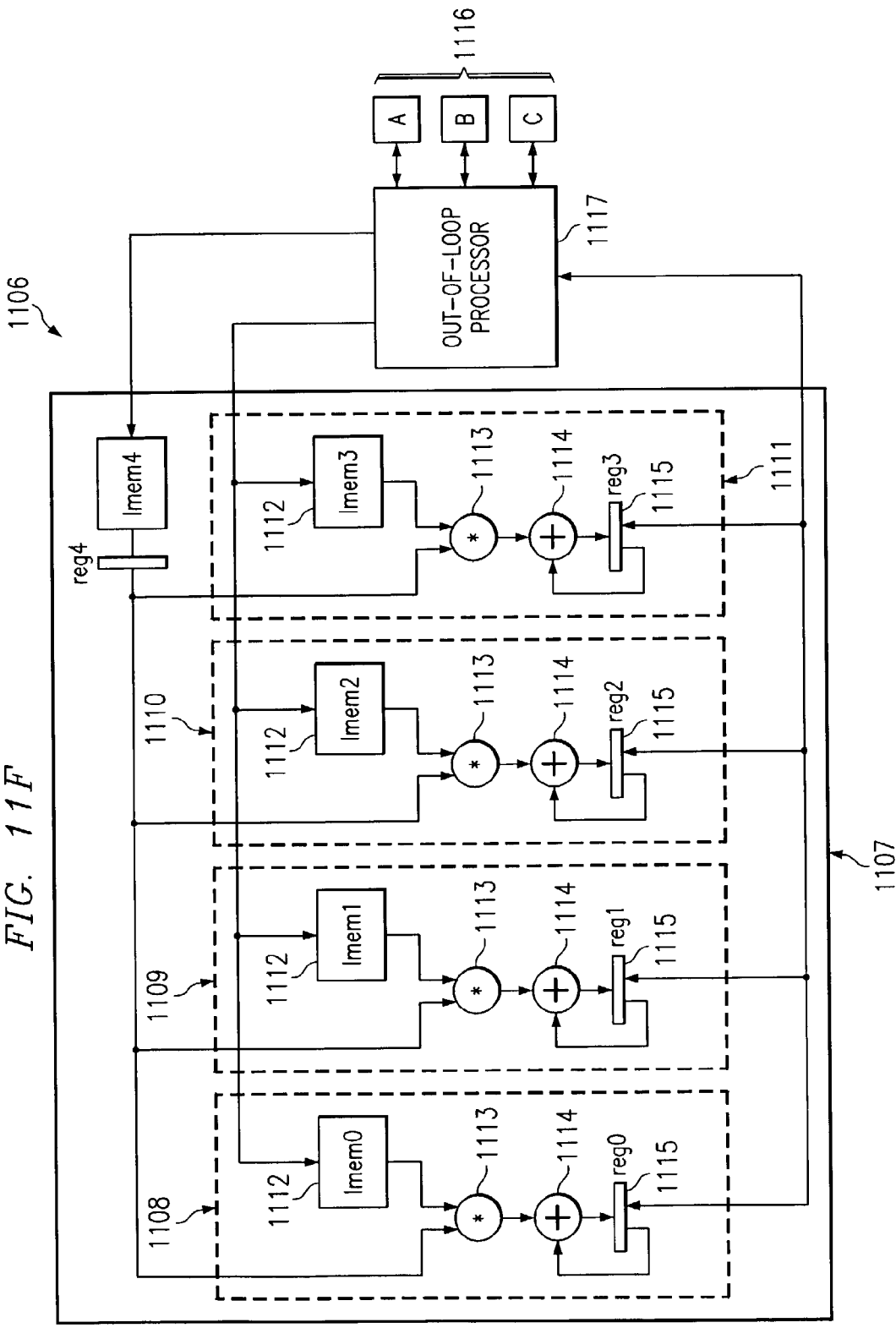

The code 1105 corresponds to the virtual datapath 1106, as shown in FIG. 11F. Box 1107 contains virtual resources for the inner-loop solver, including four copies 1108, 1109, 1110, 1111 of the symmetric cluster. The symmetric cluster contains a local memory (lmem) 1112, a multiply operation 1113, an add operation 1114, and a register 1115. Box 1107 also contains virtual resources for the asymmetric cluster, which includes lmem(4) and reg(4). Note that this corresponds to the asymmetric operation reg(4)=lmem(4)[i*M+k] of code 1105. Further note that reg(4) fans out and is connected to the multiply operations of the symmetric clusters. This corresponds to the multiply portion of the symmetric operation reg(s)=reg(s)+reg(4)*lmem(s) of code 1105. The remainder of the code 1105 similarly matches up with components and/or connections of the virtual datapath 1106. Note that for simplicity, some operations such as address computations are not explicitly shown.

The virtual datapath 1106 also includes the virtual out-of-loop processor 1117. This processor 1117 would comprise components similar to the inner loop solver, but for the sake of simplicity, it has been represented with a box. The virtual out-of-loop processor is connected to the arrays A, B, C 1116, which are the source and destinations for the information being processed by the virtual inner-loop solver 1106. The connections from 1117 to A, B, and C are a logical view. For example, in the final solver these arrays may be located in global memory, and there may be a single physical port that connects the out-of-loop processor 1117 to global memory or cache.

After cluster assignment, FU allocation is performed once for each cluster at the given initiation interval (II). Recall that II is the number of cycles available to execute an iteration of the loop. If II>1, then sharing of hardware may be possible. For example, if II=2 and there are two ADD operations in an iteration, then it might be possible to execute both operations on the same physical adder. In general, FU allocation will allocate the fewest resources possible for a given II. In code 1105, FU allocation is performed on OP1, and then a different FU allocation is performed on OP2.

The invention next performs modulo scheduling of the inner-loop for the given II. Operations from all clusters are scheduled together, but operations can only be bound to FUs in the operation's cluster. For the code 1105, OP41 and OP42 are scheduled jointly but can only be bound to resources from their respective FU allocations. Each symmetric operation is scheduled once, and then this schedule as well as the underlying FU allocation is replicated to form the final solver. The modulo scheduler is aware of this spatial replication while making its scheduling decisions. For example, in code 1105, OP42 must come after OP41 in the schedule since OP41 produces a value that is used by OP42. The modulo-scheduler will schedule a single copy of OP42 and will correctly schedule OP42 after OP41. However, as seen in 1106, all copies of OP42 (which correspond to the multiplies) must be scheduled after OP41, not just one copy. But this is not a problem because when OP42 gets replicated, the schedule is identical and hence all copies of OP42 will be scheduled after OP41, as required.

The invention now runs hardware allocation for the out-of-loop code and scheduling for the out-of-loop code. Finally, the invention takes the results of FU allocation and scheduling for both inner-loop and out-of-loop code, and generates a hardware/software description for the overall solver.

Figure 12E:
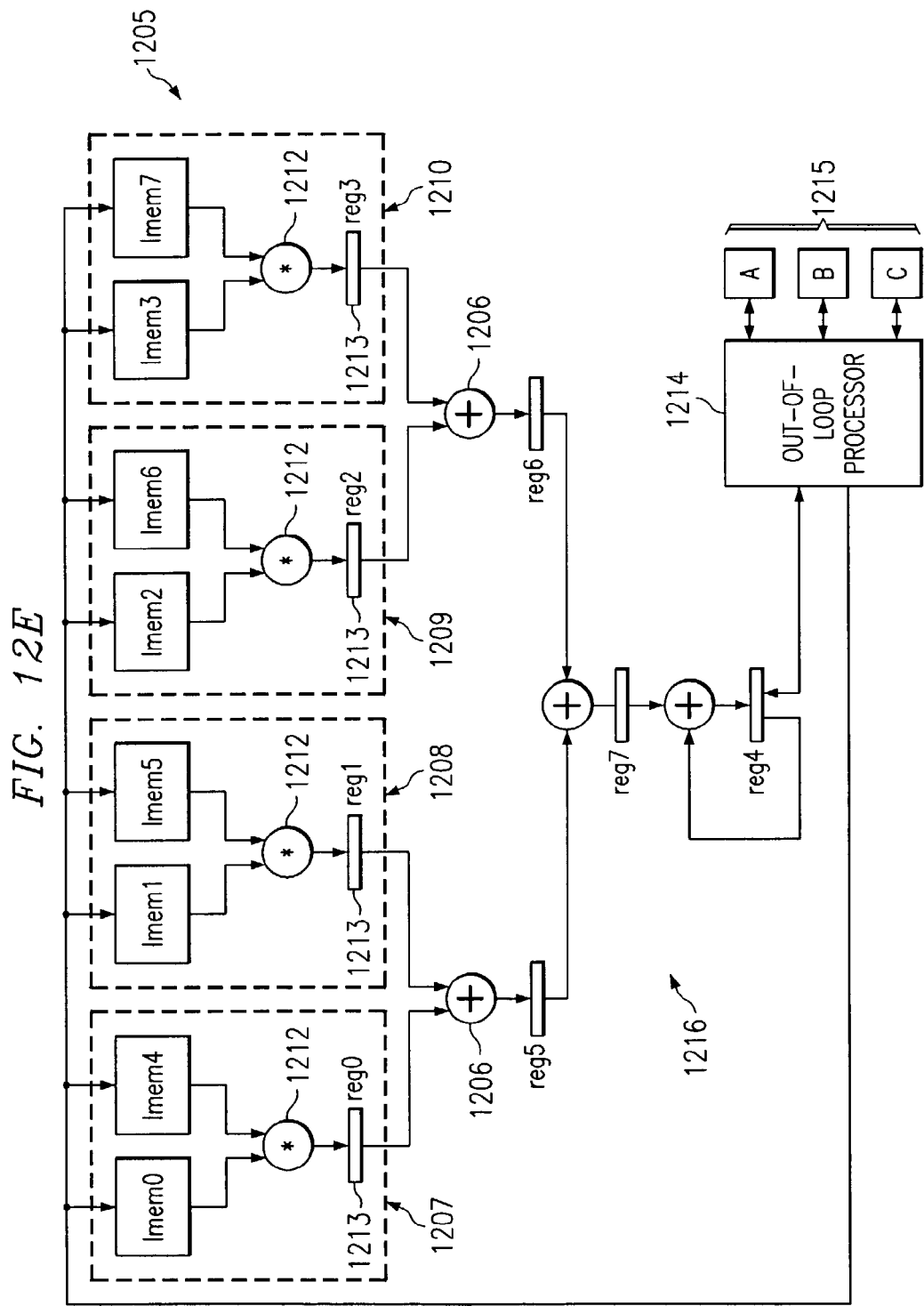

The invention would then return to step 204 and generate another spatial strip-mining for the current time mapping, until no other good spatial strip-minings exist. The invention would then select another time mapping, and repeat the process until no other good time mappings exist. The invention may iterate through one or more time mappings before processing the solver of FIGS. 12A–12E or the invention may select the time mapping of FIG. 12A as the next time mapping. Note the invention may exhaustively form family members, or the invention may be set to form a subset of the possible family muristic decisions. The final solver formed from the virtual datapath in FIG. 12E is different from that of the final solver formed from the virtual datapath of FIG. 11F, and operates in a different manner, but is a correct solver for the input loop code 1001.

For the second time mapping of code 1001, the invention has selected the loop order of j, i, k as the time mapping. Thus, after time mapping, the code has the loop order of j, i, k. Recall that the only dependence from code 1001 requires that OP1@<i,k,j>come after OP1@<i,k−1,j>for k>0. The time mapping j,i,k passes the legality test 204. In addition, legality test 204 did not need to use the fact that this sole dependence was associative.

In FIG. 12A, the invention has selected the k loop for spatial strip-mining. The k-loop is replaced with a space loop, s-loop, and a residual loop, k' loop to produce code 1201. The parallelism has been selected to be 4, and k is transformed into 4k'+s, and k' goes from 0 to N/4−1. The space loop goes from 0 to 3 (which is P−1).

After spatial strip-mining, the dependence from code 1001 requires that in the loop ordering of code 1201, OP61@<i,4*k'+s,j>must come after OP61@<i,4*k'+s−1,j> for 4*k'+s>0. This is true and the first part of legality test 907 passes. The second part of legality test 907 requires that there are no spatial self dependencies. The second part of legality test 907 fails on code 1201 since, for example, OP61@<i,4*k'+2,j>depends on OP61@<i,4*k'+1,l> which is a spatial self dependence on OP61 from s=1 to s=2. Since the dependence is associative, legality test 207 returns legal but records this dependence as requiring later fix-up during the realize reduction step 211. Since the code 1201 passes both legality checks 204 and 207, the invention continues processing the code.

After performing analysis of the references of the code, the invention determines that optimizations can be applied to the code.

In FIG. 12B, the code 1201 has been optimized by applying array relocation to form code 1202. In code 1202, the references to A, B, and C have been replaced with A', B', and C'. Also initialization and finalization code has been added.

In FIG. 12C, the code 1202 has been optimized by applying placement to form code 1203. The relocated arrays from code 1103 has been assigned datapath structures lmem and reg.

After performing placement, the invention would realize reductions, if required. In this case legality test 207 returned legal, but identified an associative dependence that must be handled for the legality to hold. This was the spatial self dependence in which OP81@<i,4*k'+s,j>depends on OP81@<i,4*k'+s−1,j>for 4*k'+s>0. The invention uses the properties of associativity to eliminate this dependence as shown in code 1204 (FIG. 12D). First, the addition was eliminated from OP81 and instead only the multiply result is written to reg(s) where 0<=s<=3 instead of always writing to reg(4). Then, asymmetric operations OP92,OP93,OP94, OP95 are introduced to sum the multiplier results reg(0), reg(1), reg(2), reg(3). Note that the final summation is still stored in reg(4), but the order of summation in code 1204 differs from that of code 1203. Since the add operation was given to be associative in code 1001, the result of code 1203 and 1204 will be identical. This reduction will improve the final solver, and allows operations to run in parallel.

After realizing reductions, the invention checks to ensure that the code is parallelizable, performs equivalence analysis, applies temporal and/or spatial CSE (as appropriate). In this case, there were no opportunities for temporal or spatial CSE.

The invention then detects symmetry and binds symmetric and asymmetric operations to clusters. The code 1204 has five operations. OP91 is symmetric (loops over all values of s) and the other four are asymmetric (do not loop over s). In one realization of symmetry detection, two clusters are created: {OP91} and {OP92,OP93,OP94,OP95}. Alternatively, the code 1204 could have been unrolled, yielding a single cluster of eight asymmetric operations.

The code 1204 corresponds to the virtual datapath 1205, as shown in FIG. 12E. Box 1206 contains virtual resources for the inner-loop solver, including four copies 1207, 1208, 1209, 1210 of the symmetric cluster. The symmetric cluster contains two local memories (lmem) 1211, a multiply operation 1212, and a register 1213. The symmetric operations essentially multiply two values together and store the result in a register. Box 1206 also contains virtual resources for the asymmetric cluster, which includes reg(4), reg(5), reg(6), reg(7) and four add operations that are connected to the four registers. Note that this corresponds to code 1204, for example reg(5)=reg(0)+reg(1). The remainder of code 1204 similarly matches up with components and/or connections of the virtual datapath 1205. Note that for simplicity, some operations such as address computations are not explicitly shown.

The virtual datapath 1205 also includes the virtual out-of-loop processor 1214. This processor 1214 would comprise components similar to the inner loop solver, but for the sake of simplicity, it has been represented with a box. The virtual out-of-loop processor is connected to the arrays A, B, C 1215 which are the source and destinations for the information being processed by the solver 1205. The connections from 1214 to A, B, and C are a logical view. For example, these arrays may be located in global memory, and there may be a single physical port that connects the out-of-loop processor 1214 to global memory or cache.

After cluster assignment, FU allocation is performed once for each cluster at the given initiation interval (II). In code 1204, FU allocation is performed on {OP91}, and then a different FU allocation is performed on {OP92, OP93, OP94, OP95}. Note that if II=2, FU allocation might determine that two adders is sufficient to execute the four ADD operations in the asymmetric cluster. However sharing across clusters, or across copies of a symmetric cluster may not be possible. For example, the four multiply operations seen in the virtual datapath 1205 will each get mapped to a different multiplier, even if II>1.

The invention next performs modulo scheduling of the inner-loop for the given II. Operations from all clusters are scheduled together, but operations can only be bound to FUs in the operation's cluster. Thus, OP91 can only be bound to FUs from the {OP91} FU allocation, while OP92, OP93, OP94, and OP95 can only be bound to FUs from the {OP92,OP93,OP94,OP95} FU allocation. Each symmetric operation is scheduled once, and then this schedule as well as the underlying FU allocation is replicated to form the final processor. The modulo scheduler is aware of this spatial replication while making its scheduling decisions. For example, in code 1204, OP91 must be scheduled before OP92 because of a dependence when s=0, and OP91 must be scheduled before OP93 because of a dependence when s=2. Because only one copy of OP92 is scheduled, it must be scheduled before both OP92 and OP93 to satisfy these constraints. When cluster {OP91} gets replicated, the schedule is identical and hence all copies of OP91 will be scheduled before both OP92 and OP93.

The invention now runs hardware allocation for the out-of-loop code and scheduling for the out-of-loop code. Finally, the invention takes the results of FU allocation and scheduling for both inner-loop and out-of-loop code, and generates a hardware/software description for the overall solver.

The invention would then generate another spatial strip-mining for the current time mapping, until no other spatial strip-minings exist. The invention would then select another time mapping, and repeat the process until no other time mappings exist. After completion of the family, the invention may then evaluate the family members to determine which member best meets certain criteria.

Note that the two final solvers are different in their respective layouts, but may have some similarities, e.g. both have the same number of adders and multipliers. Also notice that each solver has components that are homogeneous (e.g. from the symmetric clusters), but also includes heterogeneous components (e.g. from the asymmetric cluster). For example, the reduction tree is spatially heterogeneous. The solvers are also temporally heterogeneous in that the out-of-loop processors execute code portions apart from the inner loop solver. Such execution may form a temporal hiccup from the point of view of the inner-loop solver. Note that a temporal hiccup is when execution drops out of the inner loop to perform an operation, e.g. fill memory locations, and then proceeds back into the inner loop.

FIGS. 13–14 depict an example of the operation of the invention to a solver of a family of solvers. Note the invention may have operated to form different and/or additional family members. Further note that other code could be used and that this code is used by way of example only.

FIG. 13 depicts a version of Sobel code. Sobel code 1301 is used in image analysis to detect edges. Thus, this is the code 1301 that the invention operates on in FIGS. 14A–14G.

The invention selects the loop order of i, j as the time mapping. Since the loop order has not changed from 1301, the time mapping passes legality test 204. In FIG. 14A, the invention has selected the i loop for spatial strip-mining. The i loop is replaced with a space loop, s loop, and a residual loop, i' loop to produce code 1401. The parallelism has been selected to be 4, and i is transformed into 4i'+s, and i' goes from 0 to L/4−1. The space loop goes from 0 to 3 (which is P−1). Note that the code 1301 contains four scalars: a, b, c, and threshold. As part of space mapping, scalar expansion is applied to any scalar that is always written in the loop prior to being read. In code 1301, OP1 always writes to "a" prior to OP3 reading "a", and hence "a" is scalar expanded to the array a[ ]. Similarly, b and c are scalar expanded to b[ ] and c[ ], while the read-only scalar "threshold" is left alone, as seen in code 1401. Since code 1301 has no dependencies except for these scalar dependencies, legality check 207 returns legal, and the invention continues processing the code.

After performing analysis of the references of the code, the invention determines that optimizations can be applied to the code. The code 1401 has been optimized by applying the promotion. In this example, nothing is done for array relocation. During the placement step, the invention maps arrays a[ ], b[ ], and c[ ], as well as the scalar "threshold" to registers. In the resulting code 1450 in FIG. 14B, the references to a[s], b[s], c[s], and threshold have been replaced with reg(s), reg(s+4), reg(s+8), and reg(12), respectively. Also initialization code has been added for "threshold" above the i' loop. No initialization code was required for a, b, and c, because they were not live-in to the inner-loop. In addition, none of the four variables were live-out, so no finalization code was required.

The legality tests 204 and 207 did not make use of associativity, and hence the reduction step is not needed on code 1450. The invention then performs equivalence analysis on code 1450. Note the six references to array x in code

1450. Many of the references access the same addresses in memory. Thus, the invention makes use of this and applies CSE to code 1450.

In FIG. 14C, the code 1402 has been obtained by applying CSE on code 1450, specifically temporal load/store elimination. This optimization creates expanded virtual registers (EVRs). Recall that an EVR is a linear array of registers with a special operation "remap". A remap operation shifts all of the values in the EVR. In the following discussion, EVRs will be abbreviated as VRs or virtual registers. The notation vr(s) is used to refer to the s-th virtual register in the same way that we use lmem(s) and reg(s) to refer to the s-th local memory and s-th (non-virtual) register. Brackets [ ] are used to index the VR. For example, vr(12)[0], vr(12)[1], and vr(12)[2] refer to three registers in vr(12). A "remap vr(12)" operation would perform the following copies: "vr(12)[2]=vr(12)[1]; vr(12)[1]=vr(12)[ ]". Note that if vr(s) appears in the code, then s must have a static upper bound since this expression is statically mapped to fixed resources. In addition, the index to a VR is always a compile time constant, and the minimum and maximum index to a given VR can always be determined, which makes the remap operation well-defined.

In code 1402, temporal out-of-loop code is created to initialize eight VRs vr(0), vr(1), vr(2), vr(3), vr(4), vr(5), vr(6), and vr(7). Two registers (indices 1 and 2) in each of these eight VRs are initialized. In the inner loop, many of the references to x have been replaced by an equivalent reference to a vr. For example. OP21 in code 1450 has the reference x[4*'+s,j] which corresponds to vr(s)[2] of OP33 in code 1402. Thus, instead of six references to array x in the inner loop, only two references remain in the inner loop.

The invention then determines that additional common subexpressions exist, and thus applies CSE again. Specifically, the invention applies spatial load/store elimination to form code 1403 as shown in FIG. 14D. Note in code 1402, the OP31 and OP32 are symmetric operations over all s, and each reference the x array. By looking at the references to x for different values of s, spatial common subexpressions are found. In this case, OP31@s=2 and OP32@s=0 both reference x[4*i+2,j+2]. Also, OP31 @s=3 and OP32@s=1 both reference x[4*i+3,j+2]. As a result, the references to x in OP31@s=2 and OP31 @s=3 can be eliminated. To this end, OP31 of code 1402 is replaced by OP41 of code 1403 in which s goes from 0 to 1 instead of 0 to 3. Note that vr(2) and vr(3) are no longer assigned in this operation. Hence, any uses of vr(2) and vr(3) must be replaced with vr(4) and vr(5), respectively, which correspond to OP32@s=0 and OP32@s=1. In code 1402, the only references to vr(2) are in OP33@s=2, and the only references to vr(3) are in OP33@s=3. Hence, OP33 is replaced by OP43 (s goes from 0 to 1) and OP44 (s goes from 2 to 3) in code 1403. Note that OP44@s=2 corresponds to OP33@s=2, where vr(4) is used in place of vr(2). Similarly, OP44@s=3 corresponds to OP33@s=3, where vr(5) is used in place of vr(3). In this example, spatial CSE eliminated two spatial references to the array x. Note that because vr(2) and vr(3) were eliminated, they no longer need to be initialized, and hence the out-of-loop initialization code is modified accordingly.

The invention then determines that additional common subexpressions exist, and thus applies CSE again. Specifically, the invention applies spatial arithmetic elimination to form the code 1404 as shown in FIG. 14E. In code 1403, the right hand side of OP45@s=0 and OP45@s=1 is identical to the right hand side of OP44@s=2 and OP44@s=3, respectively. Hence, OP44 can be eliminated. Note that this also eliminates reg(2) and reg(3). As a result, all references to reg(2) and reg(3) must be replaced by references to reg(4) and reg(5). The only reference to reg(2) is in OP46@s=2, and the only reference to reg(3) is in OP46@s=3. Hence, OP46 in code 1403 is replaced by OP55 (where s goes from 0 to 1) and OP56 (where s goes from 2 to 3) in code 1404. Note that OP56@s=2 corresponds to OP46@s=2, where reg(4) is used in place of reg(2). Similarly, OP56@s=3 corresponds to OP46@s=3, where reg(5) is used in place of reg(3). This CSE allows the computations to be shared in an asymmetric way.

The invention then detects symmetry, and binds symmetric and asymmetric operations to clusters. The code 1404 has nine operations, with s ranging from 0 to 1, 0 to 3, or 2 to 3. There are many ways to bind these operations to clusters. One choice would be to spatially unroll all nine operations, yielding a single asymmetric cluster with 28 operations. Alternatively, a partial spatial unrolling could be done as shown in FIG. 14F, code 1451. In this example, all of the operations in which s looped from 0 to 3 were replaced by two operations, one in which s ranges from 0 to 1 and the other s ranges from 2 to 3. For example, OP52 in code 1404 is replaced by OP62 and OP63 in code 1451. Note that all of the operations in code 1451 now range over s from 0 to 1 or from 2 to 3. Hence, one choice is two have two symmetric clusters, one containing {OP61, OP62, OP64, OP65, OP67, OP69, OP71, OP73}, and the other containing {OP63, OP66, OP68, OP70, OP72, OP74}. The first cluster is symmetric (loops s from 0 to 1), as is the second (loops over s from 2 to 3). FU allocation is performed on each cluster. Note that there is no asymmetric cluster is this example. However, the resulting inner-loop solver will still be asymmetric since the two symmetric clusters are different. Also note that this is example scales in the following way. If there is a parallelism of P instead of 4, then there would be the same clusters, but the second cluster would loop over s from 2 to P–1 instead of from 2 to 3.

Figure 14G:
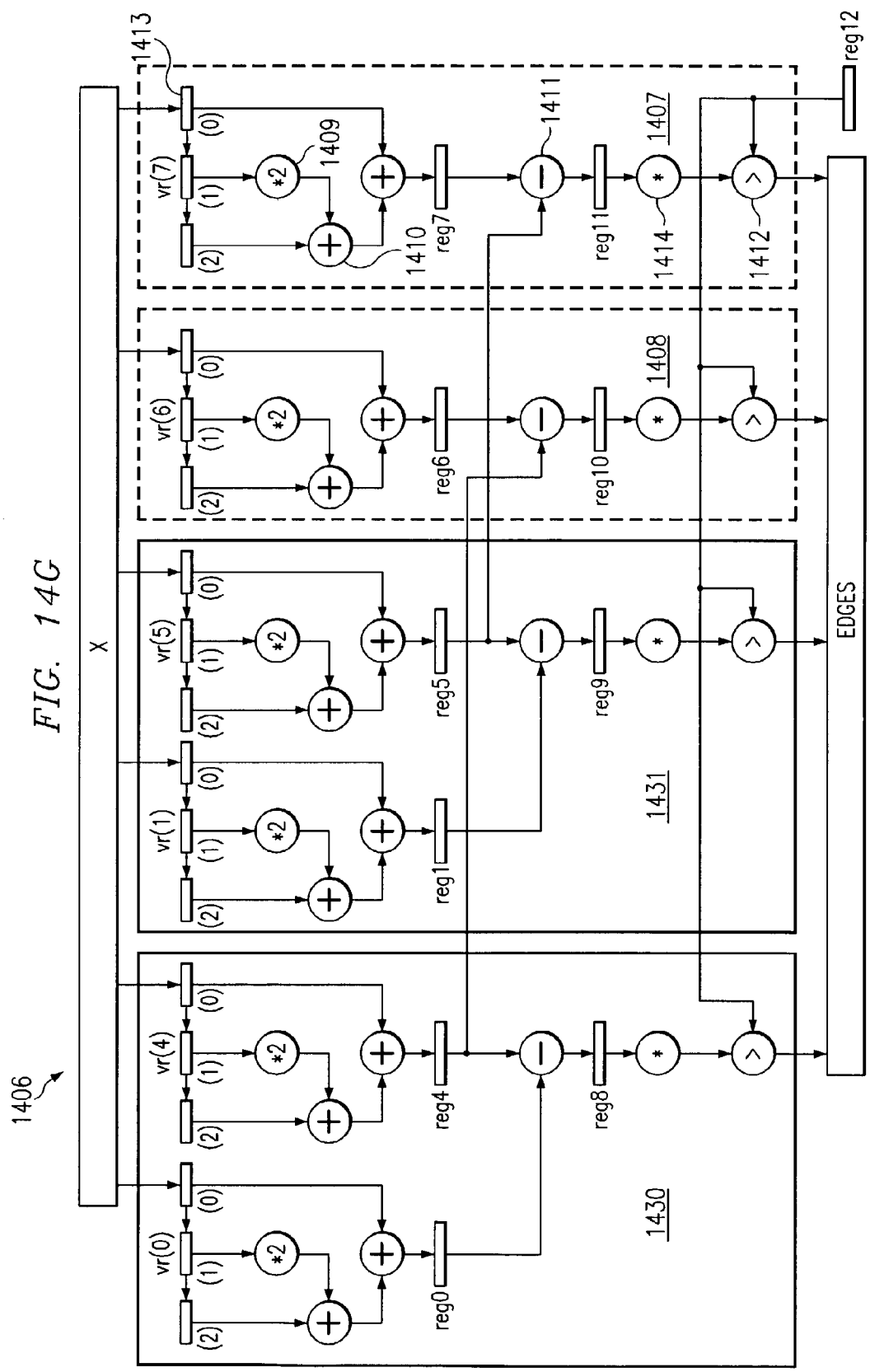

The code 1451 corresponds to the virtual datapath 1406, as shown in FIG. 14G. Box 1405 contains virtual resources for the inner loop solver, including two copies of the first symmetric cluster 1430 1431 and two copies of the second symmetric cluster 1407, 1408. The second cluster contains five registers 1413, a multiply by 2 operation 1409, two add operations 1410, a subtract operation 1411, a compare operation 1412, and a square operation 1414. The first cluster contains a different albeit similar mix of registers and operations. Note that the components and their placement correspond to code 1451. The second cluster essentially adds three values together, stores that result in register, and then subtracts that result and another value, squares this result, and compares the squared result with a value. Note that the remaps are modeled in 1405 as intra-VR wire connections instead of as an operation. The connections in 1405 to "X" and "edges" 1214 are a logical view. For example, these arrays may be located in global memory, and there may be a single physical port that connects the inner-loop solver to the global memory or cache. The required porting will depend on the II and the available memory bandwidth.

The virtual datapath 1405 also includes a virtual out-of-loop processor (not shown). This processor would comprise components to perform the out-of-loop tasks.

After cluster assignment, FU allocation is performed once for each cluster at the given initiation interval (II). In code 1451, FU allocation is performed on {OP61, OP62, OP64, OP65, OP67, OP69, OP71, OP73}, and then a different FU allocation is performed on {OP63, OP66, OP68, OP70, OP72, OP74}.

The invention next performs modulo scheduling of the inner-loop for the given II. Operations from all clusters are scheduled together, but operations can only be bound to FUs in the operation's cluster. Each symmetric operation is scheduled once, and then this schedule as well as the underlying FU allocation is replicated to form the final hardware. The modulo scheduler is aware of this spatial replication while making its scheduling decisions. For example, in code 1451, OP65 of the first cluster must be scheduled before OP68 of the second cluster because of a dependence through reg(4) and reg(5). Because of the symmetry of data flow between the two clusters as seen in the virtual datapath 1405, the modulo scheduler need only schedule OP65 prior to OP68 to satisfy both reg(4) and reg(5) dependencies. When the clusters are replicated, the schedule times of the operations are also replicated, and hence all copies of OP65 will be scheduled before all copies of OP68.

The invention now runs hardware allocation for the out-of-loop code and scheduling for the out-of-loop code. Finally, the invention takes the results of FU allocation and scheduling for both inner-loop and out-of-loop code, and generates a hardware/software description for the overall solver.

The invention would then return would then generate another spatial mapping for the current permutation, until no other spatial mappings exist. The invention would then select another time mapping and repeat the process until no other time mappings exist. After completing the family, the invention may then evaluate the family members to determine which member best meets certain criteria.

When implemented in software, the elements of the present invention are essentially the code segments to perform the necessary tasks. The program or code segments can be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

FIG. 15 illustrates computer system 1500 adapted to use the present invention. Central processing unit (CPU) 1501 is coupled to system bus 1502. The CPU 1501 may be any general purpose CPU, such as an HP PA-8500 or Intel Pentium processor. However, the present invention is not restricted by the architecture of CPU 1501 as long as CPU 1501 supports the inventive operations as described herein. Bus 1502 is coupled to random access memory (RAM) 1503, which may be SRAM, DRAM, or SDRAM. ROM 1504 is also coupled to bus 1502, which may be PROM, EPROM, or EEPROM. RAM 1503 and ROM 1504 hold user and system data and programs as is well known in the art.

Bus 1502 is also coupled to input/output (I/O) controller card 1505, communications adapter card 1511, user interface card 1508, and display card 1509. The I/O adapter card 1505 connects to storage devices 1506, such as one or more of a hard drive, a CD drive, a floppy disk drive, a tape drive, to the computer system. The I/O adapter 1505 is also connected to printer 1514, which would allow the system to print paper copies of information such as document, photographs, articles, etc. Note that the printer may be a printer (e.g. dot matrix, laser, etc.), a fax machine, or a copier machine. Communications card 1511 is adapted to couple the computer system 1500 to a network 1512, which may be one or more of a telephone network, a local (LAN) and/or a wide-area (WAN) network, an Ethernet network, and/or the Internet network. User interface card 1508 couples user input devices, such as keyboard 1513, pointing device 1507, and microphone 1516, to the computer system 1500. User interface card 1508 also provides sound output to a user via speaker(s) 1515. The display card 1509 is driven by CPU 1501 to control the display on display device 1510.

What is claimed is:

1. A method for forming a solver for a loop nest of code, the method comprising:

forming a time and space mapping of a portion of the loop nest;

performing at least one optimization that is dependent on the time and space mapping to the portion of the loop nest to form an optimized portion of the loop nest, the optimized portion comprising symmetric code that is identical for multiple iterations of a loop within the loop nest and the optimized portion comprising asymmetric code that is outside of the loop; and forming a heterogeneous solver from the optimized portion of the loop nest, the heterogeneous solver comprising homogeneous components corresponding to the symmetric code and heterogeneous components corresponding to the asymmetric code.

2. The method of claim 1, further comprising:

repeating the forming a time and space mapping, the performing, and the forming a solver with the another time and space mapping until a predetermined criteria is met, thereby forming a plurality of solvers.

3. The method of claim 2, further comprising:

selecting at least one solver from the plurality solvers for use in a system based upon at least one operating criteria.

4. The method of claim 3, wherein the at least one operating criteria is at least one of a cost criteria and a performance criteria.

5. The method of claim 1, further comprising:

performing a legality check on the time and space mapping prior to the forming a solver.

6. The method of claim 1 wherein the forming a time and space mapping comprises:

forming a permutation of the portion of the loop nest; and performing a spatial strip-mining on the portion of the loop nest.

7. The method of claim 6, wherein forming a permutation comprises:

selecting at least one element of the portion of loop nest;

changing a time of execution of the one element by changing the location of the one element in an order of the portion of loop nest.

8. The method of claim 6, wherein performing a spatial strip-mining comprises:

selecting a plurality of loops of the loop nest; and strip-mining the plurality of loops such that each loop may execute in parallel with the other loops of the plurality of loops.

9. The method of claim 8, wherein the strip-mining is performed on the permutation.

10. The method of claim 1, wherein the solver is a software solver.

11. The method of claim 10, wherein the software solver comprises code that upon execution, performs a function of the solver.

12. The method of claim 1, wherein the solver is a hardware solver.

13. The method of claim 12, wherein the hardware solver comprises a layout in hardware description language.

14. The method of claim 1, wherein the optimization forms boundary code in the portion of the loop nest.

15. The method of claim 1, wherein the optimization is selected from the group consisting of:
load/store elimination, common sub-expression elimination, and associative reduction.

16. The method of claim 1, wherein the optimization is promotion.

17. The method of claim 16, wherein the promotion is array promotion.

18. The method of claim 1, wherein the asymmetric code is spatially asymmetric.

19. The method of claim 18, wherein the asymmetric code is temporally asymmetric.

20. The method of claim 1, wherein said forming the solver comprises performing module scheduling for the symmetric code to form a schedule for the symmetric code and separately forming a schedule for the asymmetric code.

21. The method of claim 1, wherein said forming the solver comprises performing symmetry detection.

22. A system for forming a solver for a loop nest of code comprising:
means for forming a time and space mapping of a portion of the loop nest;
means for performing at least one optimization that is dependent on the time and space mapping to the portion of the loop nest to form an optimized portion of the loop nest, the optimized portion comprising symmetric code that is identical for multiple iterations of a loop within the loop nest and the optimized portion comprising asymmetric code that is outside of the loop; and
means for forming a heterogeneous solver from the optimized portion of the loop nest the heterogeneous solver comprising homogeneous components corresponding to the symmetric code and heterogeneous components corresponding to the asymmetric code.

23. The system of claim 22, wherein the means for forming a time and space mapping, the means for performing, and the means for forming a solver repeat operations with the another time and space mapping until a predetermined criteria is met, thereby forming a plurality of solvers.

24. The system of claim 23, further comprising:
means for selecting at least one solver from the plurality solvers for use in a system based upon at least one operating criteria.

25. The system of claim 24, wherein the at least one operating criteria is at least one of a cost criteria and a performance criteria.

26. The system of claim 22, further comprising:
means for performing a legality check on the time and space mapping prior to the forming solver.

27. The system of claim 22 wherein the means for forming a time and space mapping forms a permutation of the portion of the loop nest, and performs a spatial strip-mining on the portion of the loop nest.

28. The system of claim 27, wherein means for forming a time and space mapping selects at least one element of the portion of loop nest, and changes a time of execution of the one element by changing the location of the one element in an order of the portion of loop nest to form the permutation.

29. The system of claim 27, wherein means for forming a time and space mapping selects a plurality of loops of the loop nest, and strip-mines the plurality of loops such that each loop may execute in parallel with the other loops of the plurality of loops.

30. The system of claim 29, wherein the strip-mining is performed on the permutation.

31. The system of claim 22, wherein the solver is a software solver.

32. The system of claim 31, wherein the software solver comprises code that upon execution, performs a function of the solver.

33. The system of claim 22, wherein the solver is a hardware solver.

34. The system of claim 33, wherein the hardware solver comprises a layout in hardware description language.

35. The system of claim 22, wherein the optimization forms boundary code in the portion of the loop nest.

36. The system of claim 22, wherein the optimization is selected from the group consisting of:
load/store elimination, common sub-expression elimination, and associative reduction.

37. The system of claim 22, wherein the optimization is promotion.

38. The system of claim 37, wherein the promotion is any promotion.

39. A computer readable medium having computer program logic recorded thereon for forming a solver for a loop nest of code, the computer program logic comprising:
logic for forming a time and space mapping of a portion of the loop nest;
logic for performing at least one optimization that is dependent on the time and space mapping to the portion of the loop nest to form an optimized portion of the loop nest, the optimized portion comprising symmetric code that is identical for multiple iterations of a loop within the loop nest and the optimized portion comprising asymmetric code that is outside of the loop; and
logic for forming a heterogeneous solver from the optimized portion of the loop nest, the heterogeneous solver comprising homogeneous components corresponding to the symmetric code and heterogeneous components corresponding to the asymmetric code.

* * * * *